(12) United States Patent
Maeda et al.

(10) Patent No.: US 9,130,610 B1
(45) Date of Patent: Sep. 8, 2015

(54) TRANSMISSION APPARATUS AND TRANSMISSION METHOD

(71) Applicant: Panasonic Corporation, Osaka (JP)

(72) Inventors: Masakatsu Maeda, Osaka (JP); Hisashi Adachi, Osaka (JP); Akinori Daimo, Hyogo (JP); Kenichi Mori, Tokyo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/607,114

(22) Filed: Jan. 28, 2015

(30) Foreign Application Priority Data

Feb. 17, 2014 (JP) ................................. 2014-027278
Jul. 8, 2014 (JP) ................................. 2014-140379

(51) Int. Cl.
*H04K 1/02* (2006.01)
*H04B 1/04* (2006.01)
*H04L 27/20* (2006.01)

(52) U.S. Cl.
CPC ................ *H04B 1/04* (2013.01); *H04L 27/206* (2013.01); *H04B 2001/0408* (2013.01)

(58) Field of Classification Search
CPC ..... H03F 3/211; H03F 1/32; H03F 2200/336; H03F 2200/451; H03F 3/245; H03F 3/217; H03F 1/0277; H03F 3/2178; H03F 3/2175; H03F 1/3282; H03F 2203/21106; H03F 2200/405; H03F 3/189; H03F 3/68
USPC ................ 375/297, 298, 260, 261, 267, 299; 455/127.3, 102
See application file for complete search history.

(56) References Cited

U.S. PATENT DOCUMENTS

2010/0289578 A1* 11/2010 Cao ............................... 330/251

OTHER PUBLICATIONS

Sang-Min Yoo et al. "A Switched-Capacitor RF Power Amplifier" IEEE Journal of Solid-State Circuits, vol. 46, No. 12, Dec. 2011, pp. 2977-2987.
Moneza S. Alavi et al. "All-Digital RF I/Q Modulator" IEEE Transactions on Microwave Theory and Techniques, vol. 60, No. 11, Nov. 2012, pp. 3513-3526.

* cited by examiner

*Primary Examiner* — Rahel Guarino
(74) *Attorney, Agent, or Firm* — Seed IP Law Group PLLC

(57) ABSTRACT

A transmission apparatus includes a digital amplifier having a plurality of class-D amplifiers connected in parallel to each other, each of the class-D amplifiers including a logic circuit that processes input signals from two input terminals and outputs the input signals to one of two output terminals, according to a selection signal, and including capacitors connected in series to the two output terminals, respectively, a first selection circuit that outputs either an in-phase component or a quadrature component of a transmission signal to the digital amplifier depending on the selection signal, and a second selection circuit that outputs either an in-phase component carrier signal or a quadrature component carrier signal to the digital amplifier depending on the selection signal.

11 Claims, 18 Drawing Sheets

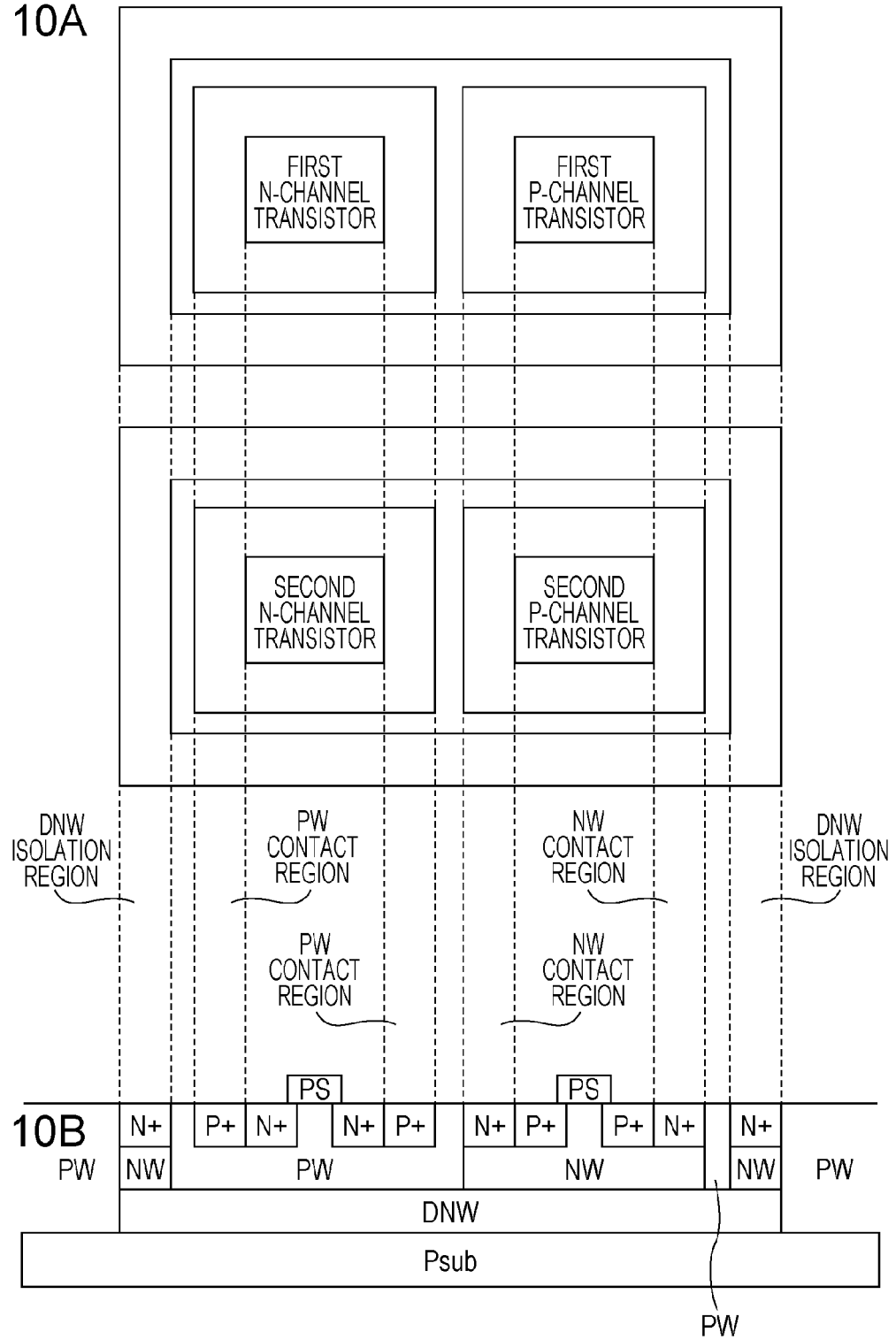

TRANSMISSION APPARATUS AND TRANSMISSION METHOD

CROSS REFERENCES TO RELATED APPLICATIONS

This application claims priority to Japanese Patent Applications No. 2014-140379, filed on Jul. 8, 2014, and No. 2014-027278, filed on Feb. 17, 2014, the contents of each of which are hereby incorporated by reference.

BACKGROUND

1. Technical Field

The present disclosure relates to a transmission apparatus and a transmission method.

2. Description of the Related Art

In wireless communication, a low cost and low power consumption transmission apparatus is needed. To reduce power consumption, replacement of power amplifiers of high power consumption is effective. One of low power consumption power amplifiers is a class-D amplifier.

Class-D amplifiers have a structure that alternately turns on the switch between the power source and the output and the switch between the ground and the output and performs an output. Since there is ideally no current consumption other than current flowing through the load, class-D amplifiers have high power efficiency.

However, conventional class-D amplifier have the following technical problems concerning the control method for output power and its linearity.

Since an output of a class-D amplifier is ideally connected to the power source or ground through a switch, the amplitude of the output voltage swings between the power source and the ground. Accordingly, the amplitude of the output voltage can be controlled by changing the power voltage, but a low noise and high response low drop-out (LDO) regulator is necessary to change the power voltage. Since a high speed LDO changes the voltage through a resistance loss of a transistor, a power loss occurs. In addition, when the power voltage is lowered, the ON resistance of the above switch increases and the linearity of the amplitude of the output voltage relative to the power voltage becomes worse, thereby degrading output signal distortion properties during inputting of a modulation signal with amplitude variations.

A solution to these problems is a switched capacitor power amplifier (referred to below as an SCPA) (see "A Switched-Capacitor RF Power Amplifier", IEEE JOURNAL OF SOLID-STATE CIRCUITS, VOL. 46, NO. 12, DECEMBER 2011). An SCPA solves the above problems while keeping the high efficiency of a class-D amplifier.

The equivalent circuit of an SCPA has a structure in which a plurality of class-D amplifiers each having a series capacitor connected to the AND output are connected in parallel. Of the class-D amplifiers connected in parallel, a number of class-D amplifiers proportional to an output power control signal reach the operating state and the AND outputs of the other class-D amplifiers are fixed to the ground electric potential. In this structure, output signals from the class-D amplifiers in the operating state are transferred to the output side through the series capacitors and are also transferred to the ground through the series capacitors of the class-D amplifiers in the stop state. That is, the output signals from the class-D amplifiers in the operating state are transferred to the output side and the output power is determined by the capacitance ratio.

In implementation of an SCPA on a semiconductor, since high relative precision is expected even though there are variations in manufacturing, it is possible to obtain high linearity and wide output power variable range without performing correction. Since the series capacitor of the AND output is always connected to the power source or the grounding point, which is the ground, regardless of whether the class-D amplifier is in the operating state or the stop state, the output impedance is constant regardless of the output power control signal. Consequently, the LC resonance frequency with the inductor is constant regardless of the output power control signal and fundamental frequency components can be extracted stably from the output signal.

As shown in FIG. 1, the transmission apparatus disclosed in "All-Digital RF I/Q Modulator", IEEE TRANSACTIONS ON MICROWAVE THEORY AND TECHNIQUES, VOL. 60, NO. 11, NOVEMBER 2012 achieves the function of a power amplifier in addition to the function of a quadrature modulator by using two digital power amplifiers as a mixer for an in-phase component (I) and a quadrature component (Q). At the output of the power amplifier, being converted into an analog signal, the signal is a digital signal, so the analog mixer, DA converter, and post filter for an in-phase component (BB_I) and a quadrature component (BB_Q), which are necessary for a conventional analog quadrature modulator, become unnecessary. Since most of signal processing is digital signal processing, cost reduction can be achieved using recent fine semiconductor processes. In addition, since 25%-duty signals are used as carrier signals, either an in-phase component (BB_I) or a quadrature component (BB_Q) is connected to the output of the power amplifier. As a result, when the in-phase component (BB_I) is synthesized with the quadrature component (BB_Q), the individual power amplifier outputs can be connected directly without using a balun (a balun is used for difference/one-phase conversion in the above document).

SUMMARY

The transmission apparatus disclosed in "All-Digital RF I/Q Modulator", IEEE TRANSACTIONS ON MICROWAVE THEORY AND TECHNIQUES, VOL. 60, NO. 11, NOVEMBER 2012 achieves the function of a power amplifier in addition to the function of a quadrature modulator by using two digital power amplifiers as a mixer for an in-phase component (BB_I) and a quadrature component (BB_Q). However, the two power amplifiers occupy a large area on a semiconductor integrated circuit, thereby leading to cost disadvantage. In particular, the cost per unit area of semiconductor is high in recent fine semiconductor processes, so this effect is significant.

Since a polar modulation system is assumed in the SCPA described in "A Switched-Capacitor RF Power Amplifier", IEEE JOURNAL OF SOLID-STATE CIRCUITS, VOL. 46, NO. 12, DECEMBER 2011, one power amplifier is necessary. However, when the SCPA is used as a transmission apparatus, a codec for converting data from an in-phase component (BB_I) and a quadrature component (BB_Q) to the amplitude component (r) and the phase component (θ) and a phase modulator for modulating phase component (θ) for carrier waves are necessary separately. As a result, the area on the semiconductor integrated circuit and the cost increase.

The transmission apparatus disclosed in "All-Digital RF I/Q Modulator", IEEE TRANSACTIONS ON MICROWAVE THEORY AND TECHNIQUES, VOL. 60, NO. 11, NOVEMBER 2012 uses 25%-duty signals as carrier signals. Accordingly, either an in-phase component (BB_I) or a quadrature component (BB_Q) is output to the output of the power amplifier in a time division manner. That is, when switching between an in-phase component (BB_I) and a quadrature component (BB_Q) can be performed in a time division manner, a quadrature modulator can be configured by one power amplifier in theory. In this case, however, the following problem occurs.

FIG. 2 schematically shows the structure of one SCPA. As described above, an SCPA has a structure in which a plurality of class-D amplifiers each having a series capacitor connected to the AND output are connected in parallel. The SCPA in FIG. 2 includes a total of N class-D amplifiers; BB class-D amplifiers of N are in the operating state (the AND outputs of class-D amplifiers output VDD or ground electric potential square waves); N-BB class-D amplifiers of N are in the stop state (the AND outputs of class-D amplifiers are fixed to the ground electric potential). The output signals from the class-D amplifier in the operating state are attenuated by capacitance attenuator C1 and C2 and transferred to the output side.

Here, the operation of the quadrature modulator that ideally switches between an in-phase component (BB_I) and a quadrature component (BB_Q) in a time-division manner will be described. FIG. 3 shows how a carrier signal (in-phase component and quadrature component) with an amplitude proportional to the value of a baseband signal (in-phase component and quadrature component) is alternately output in a time division manner at intervals of one-quarter the carrier cycle. Generally, an ideal DA converter without considering aperture effects is represented by an impulse array including a δ function array. However, since an SCPA is also considered as a DA converter that operates at high speed, descriptions are given using a δ function array.

In FIG. 3, I(t) and Q(t) are baseband signals (in-phase component and quadrature component) and T0 is one-quarter the cycle of a carrier signal. The impulses of an in-phase component (BB_I) and a quadrature component (BB_Q), which are represented as bold lines, are output alternately in a time division manner. The waveforms of I(t) and Q(t) in FIG. 3 are represented by expressions (1) and (2), respectively, using δ function arrays.

$$I(t) \cdot \sum_{n=-\infty}^{\infty} \delta\{t - (4 \cdot n) \cdot T0\} - I(t) \cdot \sum_{n=-\infty}^{\infty} \delta\{t - (4 \cdot n + 2) \cdot T0\} \quad (1)$$

$$Q(t) \cdot \sum_{n=-\infty}^{\infty} \delta\{t - (4 \cdot n + 1) \cdot T0\} - Q(t) \cdot \sum_{n=-\infty}^{\infty} \delta\{t - (4 \cdot n + 3) \cdot T0\} \quad (2)$$

In a case where the after-sampling data of baseband signals I(t) and Q(t) is is(t) and qs(t) and expressions (1) and (2) are Fourier-transformed, expressions (3) and (4) are obtained. Where, $\omega 0 = 2\pi/T0$, $4 \cdot T0 = T04$, and $\omega 04 = 2\pi/T04$.

$$\int_{-\infty}^{\infty} is(t) \cdot \left\{ \frac{1}{T04} \sum_{n=-\infty}^{\infty} e^{-j \cdot n \cdot \omega 04 \cdot t} \right\} dt - \quad (3)$$

$$\int_{-\infty}^{\infty} is(t) \cdot \left\{ \frac{1}{T04} \sum_{n=-\infty}^{\infty} e^{-j \cdot n \cdot \pi} \cdot e^{-j \cdot n \cdot \omega 04 \cdot t} \right\} dt$$

$$\int_{-\infty}^{\infty} qs(t) \cdot \left\{ \frac{1}{T04} \sum_{n=-\infty}^{\infty} e^{-j \cdot n \cdot (\pi/2)} \cdot e^{-j \cdot n \cdot \omega 04 \cdot t} \right\} dt - \quad (4)$$

$$\int_{-\infty}^{\infty} qs(t) \cdot \left\{ \frac{1}{T04} \sum_{n=-\infty}^{\infty} e^{-j \cdot n \cdot \pi} \cdot e^{-j \cdot n \cdot (\pi/2)} \cdot e^{-j \cdot n \cdot \omega 04 \cdot t} \right\} dt$$

Since $e^{-j \cdot n \cdot \pi} = +1$ (n=even number) and $e^{-j \cdot n \cdot \pi} = -1$ (n=odd number) hold based on Euler formula $e^{-j\theta} = \cos\theta - j \cdot \sin\theta$, the first item equals the second item in expressions (3) and (4) when n is an even number. As a result, expressions (3) and (4) are zero. That is, a higher harmonic spread spectrum of an even-number-order such as a second order or fourth order does not appear.

Next, expressions (3) and (4) will be consider when n is an odd number.

$$2 \cdot \int_{-\infty}^{\infty} is(t) \frac{1}{T04} \cdot \sum_{n=-\infty}^{\infty} e^{j \cdot n \cdot \omega 04 \cdot t} = \quad (5)$$

$$\frac{2}{T04} \sum_{n=-\infty}^{\infty} \int_{-\infty}^{\infty} is(t) \cdot e^{j \cdot n \cdot \omega 04 \cdot t} dt = \frac{2}{T04} \sum_{n=-\infty}^{\infty} IS(\omega - n \cdot \omega 04)$$

$$2 \cdot \int_{-\infty}^{\infty} qs(t) \frac{1}{T04} \cdot \sum_{n=-\infty}^{\infty} e^{-j \cdot n \cdot (\frac{\pi}{2})} \cdot e^{j \cdot n \cdot \omega 04 \cdot t} dt = \quad (6)$$

$$2 \cdot \int_{-\infty}^{\infty} qs(t) \frac{1}{T04} \sum_{n=-\infty}^{\infty} e^{j \cdot n \cdot \{\omega 04 \cdot t - (\frac{\pi}{2})\}} dt =$$

$$\frac{2}{T04} \sum_{n=-\infty}^{\infty} \int_{-\infty}^{\infty} qs(t) \cdot e^{j \cdot n \cdot \{\omega 04 \cdot t - (\frac{\pi}{2})\}} dt = \frac{2}{T04} \sum_{n=-\infty}^{\infty} Qs(\omega - n \cdot \omega 04) dt$$

Expressions (5) and (6) are spectra in which the same angular velocity ω04 is used, a phase difference of π/2 is present for the fundamental wave (n=1), and the frequency spectra of waveforms I(t) and Q(t) are frequency-shifted by ω04. The spectra appear in all n-order harmonic waves (n is an odd number). Since waveforms I(t) and Q(t) are orthogonal to each other, it can be seen that the signal obtained by addition of expression (5) and (6) has the function of a quadrature modulator. For an SCPA, fundamental frequency components (one dimension) can be extracted by reducing harmonic waves using an LC resonator disposed in the output. A quadrature modulator can be configured using a period (such as, for example, ⅛, 1/16) shorter than one-quarter the carrier cycle, but this increases current consumption. Accordingly, the proof of these periods based on expressions is omitted.

Next, unnecessary harmonic wave components, which are problem described above, generated during switching between an in-phase component (BB_I) and a quadrature component (BB_Q) at intervals of one-quarter the carrier cycle using one SCPA will be described.

Since unnecessary harmonic wave components act as a signal obstructing other wireless communication, they need to be reduced to a legal allowable value or less. However, addition of a filter for reduction increases the cost and power loss. In particular, even-number-order harmonic waves are similar to the fundamental wave, so reduction using a filter increases power loss. As described above, under ideal conditions as represented by the expressions, a higher harmonic spread spectrum of an even-number-order does not appear. However, when switching between an in-phase component (BB_I) and a quadrature component (BB_Q) is performed at intervals of one-quarter the carrier cycle using a conventional SCPA, an unnecessary even-number-order higher harmonic spread spectrum is generated.

FIG. 4 shows the structure of an SCPA that receives three bits in parallel. BB{2} to BB{0} are digital baseband signals such as an in-phase component (BB_I), a quadrature component (BB_Q), and so on. BB{2} is the most significant bit (MSB) and BB{0} is the least significant bit (LSB). Weighted capacitors are connected in series to the individual AND outputs. Since the basic operation is similar to that of the structure in FIG. 2, descriptions are omitted.

FIG. 5 shows the waveforms of various signals input to the SCPA in FIG. 4 and the signal waveforms at points A0 to A2. FIG. 5 represents the time period equivalent to one cycle of the carrier signal. L(0) is input to BB{0} and BB{1}, and L(0) and H(1) are alternately input to BB{2}. This is equivalent to the inputting of BB_I=4 and BB_Q=0 as a digital baseband signal and switching between an in-phase component (BB_I) and a quadrature component (BB_Q) is performed at intervals of one-quarter the carrier cycle. When focusing on the waveform at point A2, which is the output of the AND to which BB{2} is connected, the level is H at time 0·T0 and L at time 1·T0.

Next, time variations of the voltage at point A2 are represented as expression (7) using a δ function array. Va2($t$) is the voltage at point A2.

$$Va2(t) \cdot \sum_{n=-\infty}^{\infty} \delta\{t - (4 \cdot n) \cdot T0\} + Va2(t) \cdot \sum_{n=-\infty}^{\infty} \delta\{t - (4 \cdot n + 1) \cdot T0\} \quad (7)$$

Expression (8) is obtained by Fourier-transforming expression (7).

$$\int_{-\infty}^{\infty} Va2s(t) \cdot \left\{ \frac{1}{T04} \sum_{n=-\infty}^{\infty} e^{j \cdot n \cdot \omega 04 \cdot t} \right\} dt + \\ \int_{-\infty}^{\infty} Va2s(t) \cdot \left\{ \frac{1}{T04} \sum_{n=-\infty}^{\infty} e^{-j \cdot n \cdot \left(\frac{\pi}{2}\right)} \cdot e^{j \cdot n \cdot \omega 04 \cdot t} \right\} dt \quad (8)$$

Va2$s$(t) is the after-sampling data of Va2($t$). Unlike expressions (3) and (4) above, expression (8) does not become zero regardless of whether n is an even number or odd number. That is, the signal spectrum at point A2 in FIG. 5 appears in all harmonic waves of odd-number-orders and even-number-orders.

One non-limiting and exemplary embodiment provides a transmission apparatus and transmission method suppressing the generation of unnecessary even-number-order harmonic wave components during combination of the in-phase component and the quadrature component using one SCPA.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a transmission apparatus including a digital amplifier having a plurality of class-D amplifiers connected in parallel to each other, each of the class-D amplifiers including a logic circuit that processes input signals from two input terminals and outputs the processed signals to one of two output terminals, according to a selection signal, and including capacitors connected in series to the two output terminals, respectively, a first selection circuit that outputs either an in-phase component or a quadrature component of a transmission signal to the digital amplifier depending on the selection signal, and a second selection circuit that outputs either an in-phase component carrier signal or a quadrature component carrier signal to the digital amplifier depending on the selection signal.

In another general aspect, the techniques disclosed here feature a transmission method including the steps of outputting either an in-phase component or a quadrature component of a transmission signal to a digital amplifier, outputting either an in-phase component carrier signal or a quadrature component carrier signal to the digital amplifier, and processing and outputting either the in-phase component or the quadrature component of the transmission signal and either the in-phase component carrier signal or the quadrature component carrier signal to one of two output terminals to which capacitors are connected in series, respectively.

According to one aspect of the present disclosure, an in-phase component and a quadrature component can be synthesized correctly using one SCPA.

These general and specific aspects may be implemented using a system, a method, and a computer program, and any combination of systems, methods, and computer programs.

BRIEF DESCRIPTION OF THE DRAWINGS

FIG. 10A is a plan view showing the layout of a logic circuit including two conventional SCPAs;

FIG. 10B is a vertical structural view showing the layout of the logic circuit including two conventional SCPAs;

DETAILED DESCRIPTION

Figure 1:
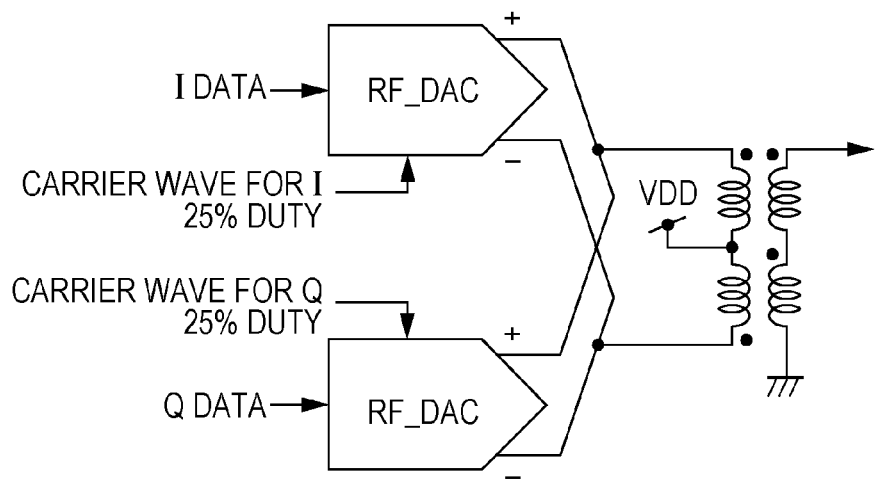
FIG. 1 shows the structure of the transmission apparatus disclosed in "All-Digital RF I/Q Modulator", IEEE TRANSACTIONS ON MICROWAVE THEORY AND TECHNIQUES, VOL. 60, NO. 11, NOVEMBER 2012.

Embodiments of the present disclosure will be described in detail with reference to the drawings. However, the components with the same function in embodiments are given the same reference characters and duplicate descriptions are omitted.

Embodiment 1

Figure 6:
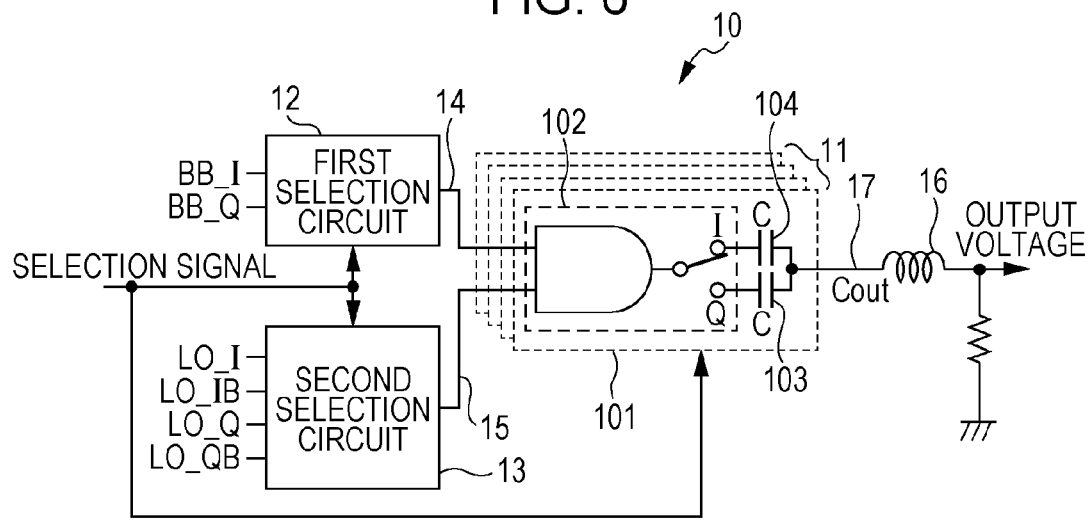
FIG. 6 shows the structure of a quadrature modulator according to embodiment 1 of the present disclosure.

FIG. 6 shows the structure of a quadrature modulator 10 according to embodiment 1 of the present disclosure. The structure of the quadrature modulator 10 will be described below with reference to FIG. 6.

A digital amplifier 11 has a plurality of class-D amplifiers 101 connected in parallel to each other. Each of the class-D amplifiers 101 includes a logic circuit 102 having two signal input terminals, two signal output terminals, and an input terminal receiving a selection signal for selecting one of the signal output terminals to which an input signal is output and capacitors 103 and 104 connected in series to the two signal output terminals of the logic circuit 102.

The digital amplifier 11 receives an in-phase component (BB_I) or a quadrature component (BB_Q), which is digital baseband data output from the first selection circuit 12, and an output signal 15, which is a carrier signal output from the second selection circuit 13.

Since the output signals of the logic circuit 102 are square waves including odd-number-order harmonic wave components, fundamental wave signal components are extracted from the output signals of the logic circuit 102 by series resonance of an inductor 16 and the capacitors 103 and 104 connected in series to the two signal output terminals of the logic circuit 102.

Although an output signal with a voltage amplitude that depends on the values of the in-phase component (BB_I) and the quadrature component (BB_Q), which are digital baseband data, is obtained by the digital amplifier 11, this principle is similar to the background art described with reference to FIGS. 2 and 3, and descriptions are omitted.

The first selection circuit 12 receives the in-phase component (BB_I) and the quadrature component (BB_Q), which are digital baseband data, selects either the in-phase component or the quadrature component depending on the selection signal, and outputs the selected component to the digital amplifier 11.

The second selection circuit 13 receives the differential signal of an in-phase component carrier signal (LO_I and LO_IB) and a quadrature component carrier signal (LO_Q and LO_QB), selects the in-phase component carrier signal or the quadrature component carrier signal depending on the selection signal as in the first selection circuit 12, and outputs the selected signal to the digital amplifier 11. Depending on whether the values of the in-phase component (BB_I) and the quadrature component (BB_Q), which are digital baseband data, are positive or negative, switching between the positive phase (LO_I or LO_Q) and the negative phase (LO_IB or LO_QB) is performed and output. This enables all of four quadrants on the IQ plane to be represented.

In a case where quadrature modulator output Cout 17 is represented by expression (9) when BB_I and BB_Q are negative values, this is equal to the addition of it to phase θ of the carrier signal. This can be achieved by use of the negative phase signal of the carrier signal.

$$\text{Quadrature modulator output } Cout\ 17 = (-I) \times \cos\theta + (-Q) \times \sin\theta = I \times \cos(\theta+\pi) + Q \times \sin(\theta+\pi) \quad (9)$$

Figure 7:
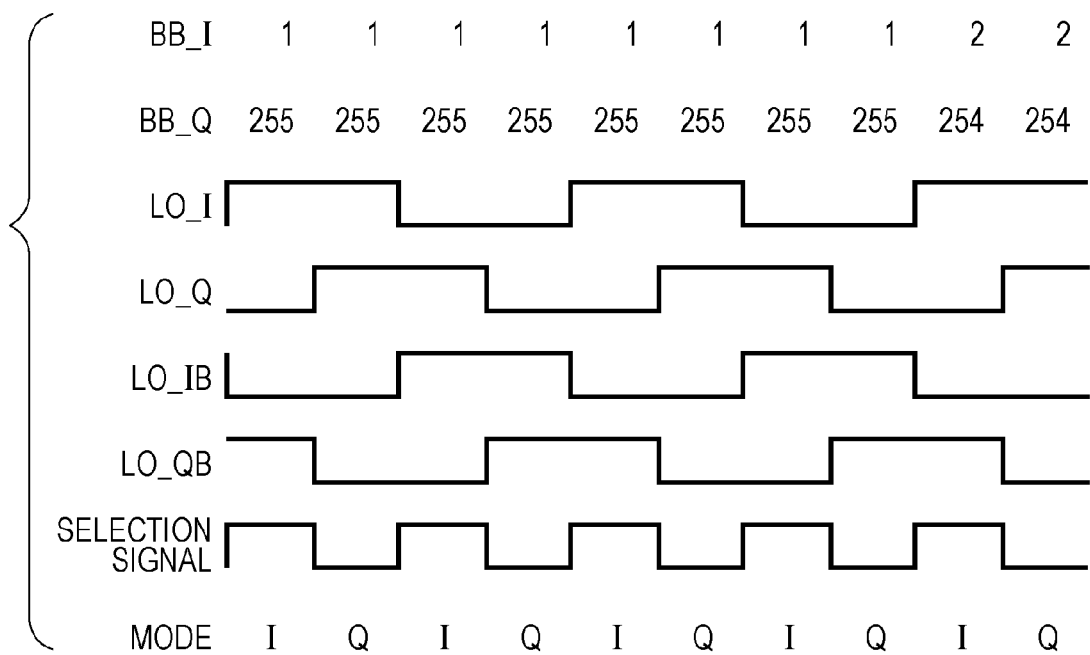
FIG. 7 shows the operation timing of the quadrature modulator shown in FIG. 6.

Next, the operation timing of the quadrature modulator 10 shown in FIG. 6 will be described with reference to FIG. 7. The mode in FIG. 7 indicates one of the in-phase component and the quadrature component that is being output. Since both the in-phase component (BB_I) and the quadrature component (BB_Q), which are digital baseband data, are positive values in FIG. 7, the positive phase carrier signals (LO_I and LO_Q) are used and switching between LO_I and LO_Q is made depending on whether the selection signal with twice the frequency of the carrier wave is high or low.

Figure 8:
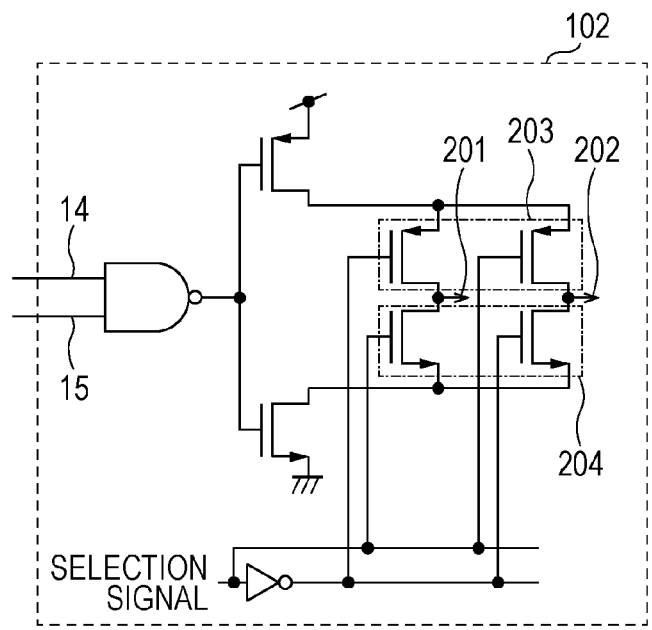
FIG. 8 shows an example of the internal structure of a logic circuit shown in FIG. 6.

FIG. 8 shows an example of the internal structure of the logic circuit 102 shown in FIG. 6. In this example, the logic circuit 102 includes two output terminals 201 and 202 to which a P-channel CMOS transistor 203 and an N-channel CMOS transistor 204 are cascode-connected. A signal is output to one of the two output terminals 201 and 202 by turning on or off the cascode transistors.

Figure 9:
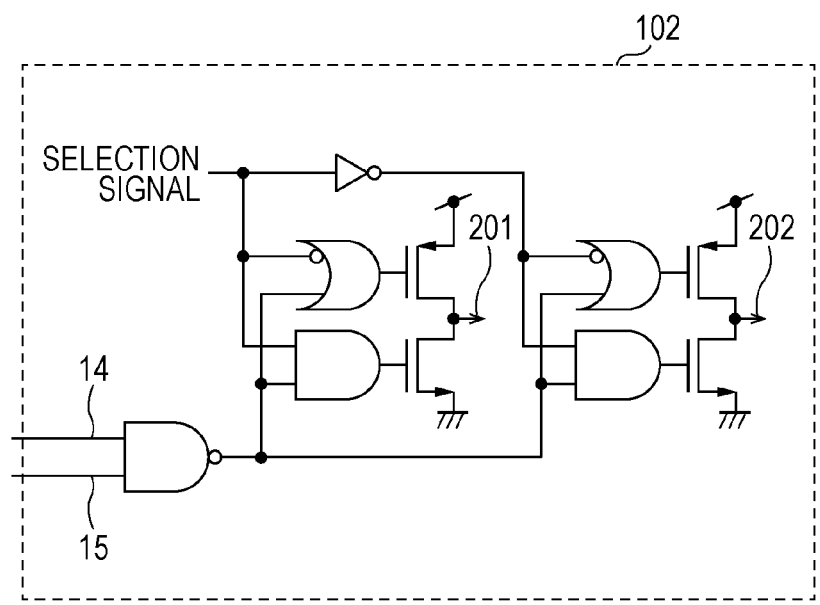
FIG. 9 shows another example of the internal structure of the logic circuit shown in FIG. 6.

FIG. 9 shows another example of the internal structure of the logic circuit 102 shown in FIG. 6. In this example, the logic circuit 102 has the same output stage circuit for each of circuit the output terminals 201 and 202 after the NAND (non-conjunction) circuit (NAND gate) to which an output signal 14 from the first selection circuit 12 and an output signal 15 from the second selection circuit 13 are input. As in the example in FIG. 8, the logic circuit 102 outputs the signal to one of the two output terminals 201 and 202 depending on whether the selection signal with twice the frequency of the carrier wave is high or low. The feature of this structure is that it has no cascode transistors and does not cause power loss. In addition, since the layout is properly designed, the area on the semiconductor integrated circuit can be used effectively.

FIGS. 10A and 10B show the layout of the logic circuit 102 (semiconductor integrated circuit) achieving the function of the quadrature modulator and the function of the power amplifier using two conventional SCPAs as a mixer for the in-phase component (BB_I) and the quadrature component (BB_Q).

Figure 2:
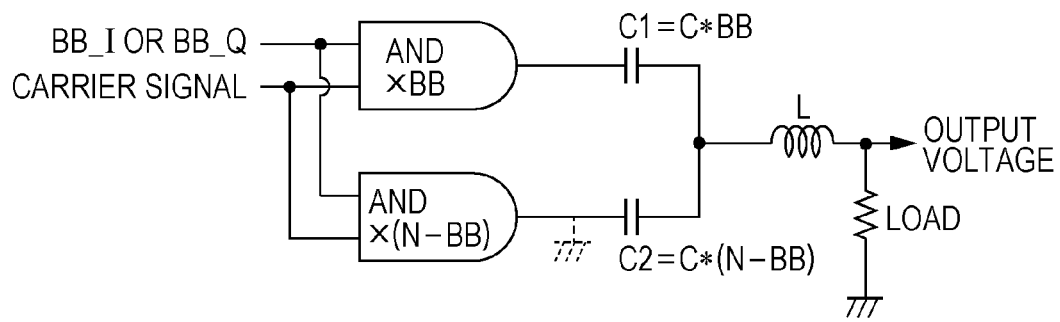
FIG. 2 schematically shows the structure of one SCPA.
Figure 3:
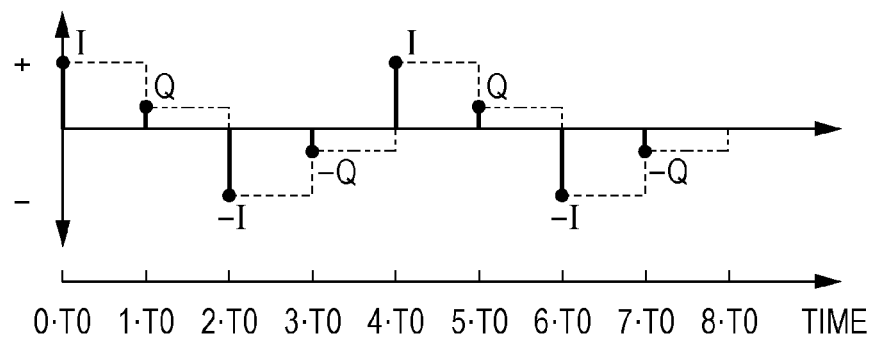
FIG. 3 shows how an in-phase component and a quadrature component are output alternately at intervals one-quarter a carrier cycle.

Since the N-channel and P-channel transistors used as the AND output of the class-D amplifier in the conventional SCPAs shown in FIG. 2 occupy the largest area, this area is shown. The first N-channel transistor and the first P-channel transistor are for in-phase components (BB_I) and the second N-channel transistor and the second P-channel transistor are for quadrature components (BB_Q).

In the plan view shown in FIG. 10A, transistors for in-phase components (BB_I) and transistors for quadrature components (BB_Q) are arranged adjacently to each other in order to make comparison with the area in an example (FIGS. 11A and 11B) of the layout in the present disclosure. Actually, the SCPAs for in-phase components (BB_I) and quadrature components (BB_Q) are subjected to layout design individually as a whole. This is because high relative precision among a plurality of class-D amplifiers in one SCPA is necessary in order to achieve linearity and a wide output power range. That is, the first N-channel transistor and the first P-channel transistor are arranged distant from the second N-channel transistor and the second P-channel transistor.

However, the SCPA for in-phase components (BB_I) and the SCPA for quadrature components (BB_Q) are arranged distant from each other, the parasitic resistance and parasitic capacitance of total wiring connecting the individual output signals cause an output power loss.

It can be seen from the layout diagram in FIG. 10A that the entire area is much larger than the areas of the first and second N-channel transistors and the first and second P-channel transistors. The reason will be described with reference to FIG. 10B. FIG. 10B is a vertical structural view showing the semiconductor integrated circuit. The first and second N-channel transistors are formed within the P-type well layer (PW) and the first and second P-channel transistors are formed within the N-type well layer (NW). Because of the structure of the semiconductor, the PW and the NW need to be connected to the GND electric potential and the power potential, respectively. Accordingly, a PW contact region and an NW contact region are provided to make connection to the electric potentials. It is preferable to use a deep N well (DNW) in addition to the PW and NW to prevent various isolation problems due to unnecessary leakage power from the output terminal 201 and 202 to the semiconductor substrate (Psub). This DNW isolation region also needs to be connected to the power potential.

For the reasons, the areas of the first and second N-channel transistors and the first and second P-channel transistors are smaller than the areas of the PW contact region, the NW contact region, and the DNW isolation region, which are their peripheral areas. As described above, the SCPA includes a plurality of class-D amplifiers 101 connected in parallel to each other. Accordingly, the size of output stage transistors used in the logic circuit 102 in one class-D amplifier 101 may be reduced by division into a plurality of pieces, but the PW contact region, the NW contact region, and the DNW isolation region are required even though their size is small. As a result, as the size of a transistor becomes smaller, the size of the PW contact region, the NW contact region, and the DNW isolation region relative to the size of the transistor look greater.

Figure 11A:
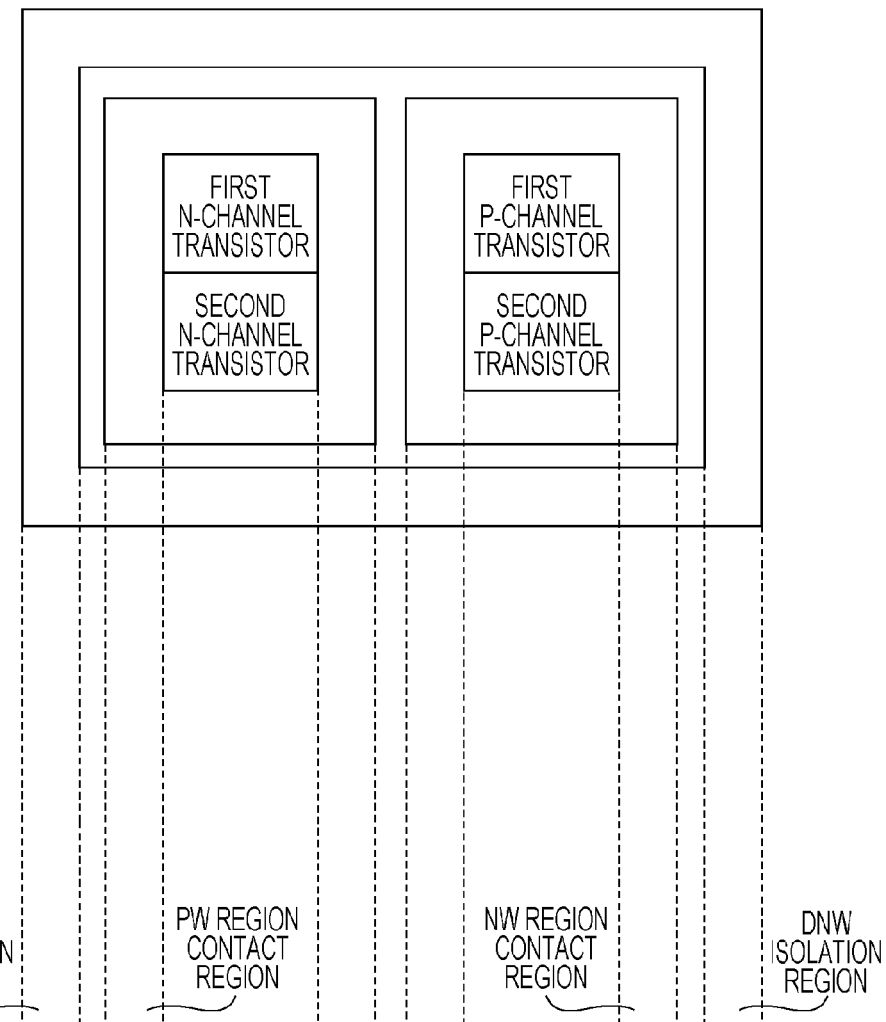
FIG. 11A is a plan view showing the layout of the logic circuit shown in FIG. 9.
Figure 11B:
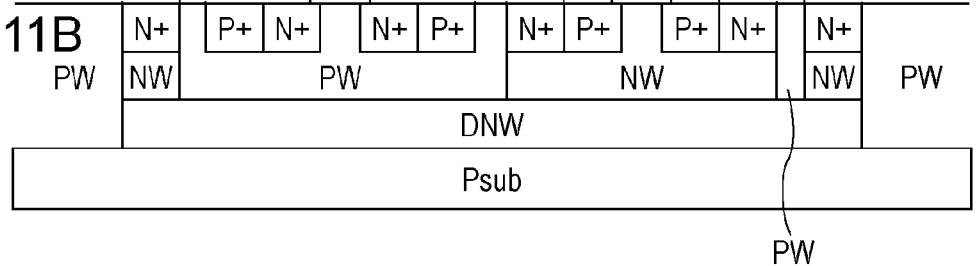
FIG. 11B is a vertical structural view showing the layout of the logic circuit shown in FIG. 9.

With respect to this, the layout of the logic circuit 102 (semiconductor integrated circuit) shown in FIG. 9 is shown in FIGS. 11A and 11B. In FIGS. 11A and 11B, the first and second N-channel transistors (or the first and second P-channel transistors) used in the output terminals 201 and 202 are arranged adjacently to each other in a single isolation region. In this arrangement, an output power loss is not caused by the parasitic resistance and parasitic capacitance of the total wiring for connecting output signals for in-phase components (BB_I) and quadrature components (BB_Q). In addition, since the required PW contact region, NW contact region, and DNW isolation region can be shared, the area on the semiconductor integrated circuit can be used effectively in the arrangement in FIG. 11A as compared with the arrangement in FIG. 10A.

Figure 12A:
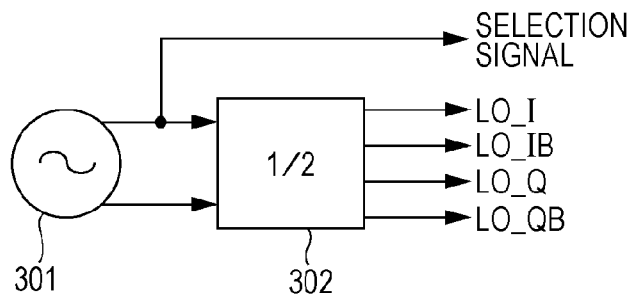
FIG. 12A shows an example of a generator for generating in-phase component carrier signals, quadrature component carrier signals, and a selection signal.
Figure 12B:
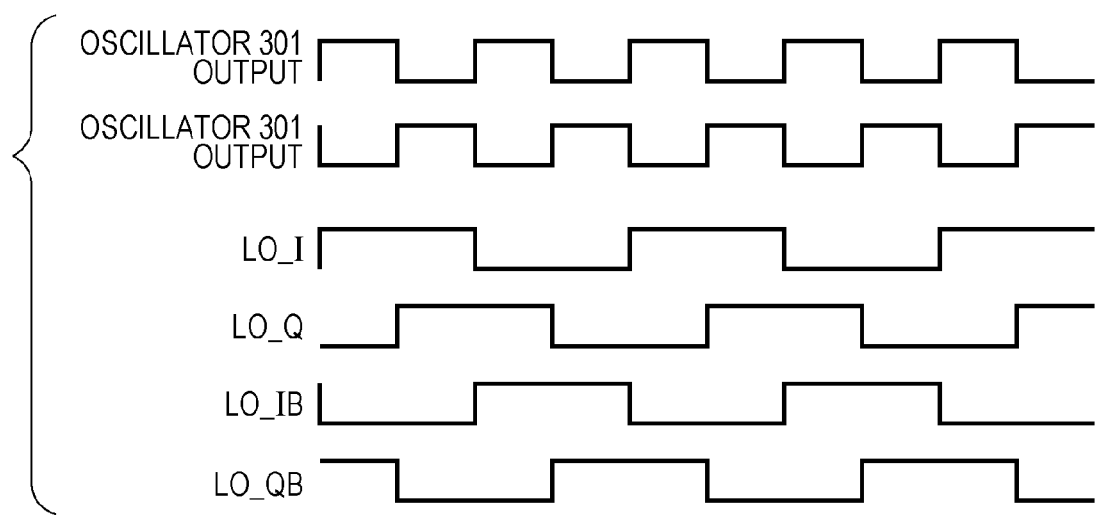
FIG. 12B shows their operation timings.

FIG. 12A shows an example of a generator for generating in-phase component carrier signals (LO_I and LO_IB), quadrature component carrier signals (LO_Q and LO_QB), and a selection signal. The differential output signal of an oscillator 301 with twice the frequency of the carrier signals is input to a ½ divider 302 to generate the carrier signals (see FIG. 12B). The oscillation signal of the oscillator 301 is used as a selection signal.

Figure 13A:
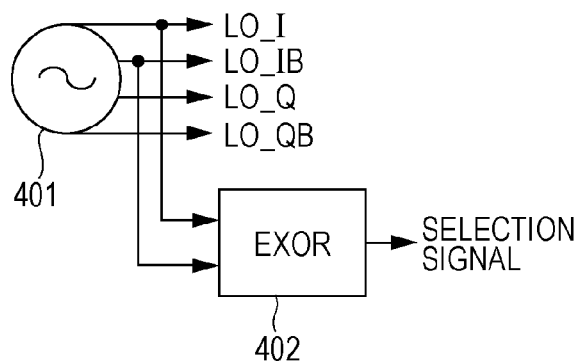
FIG. 13A shows another example of the generator for generating in-phase component carrier signals, quadrature component carrier signals, and a selection signal.

FIG. 13A shows another example of the generator for generating in-phase component carrier signals (LO_I and LO_IB), quadrature component carrier signals (LO_Q and LO_QB), and a selection signal. The generator includes an oscillator 401, which outputs four signals with phases different from each other by 90 degrees, and an exclusive OR (EX-OR) circuit 402.

Figure 13B:
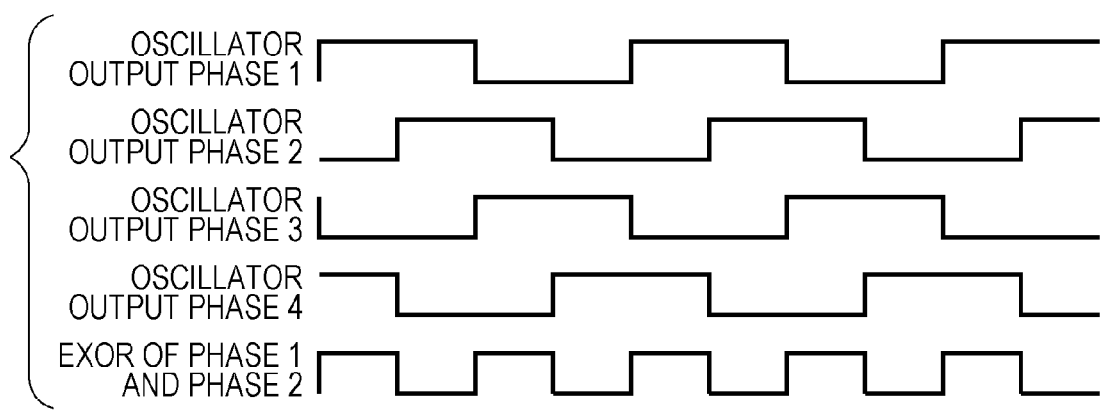
FIG. 13B shows their operation timings.

FIG. 13B shows operation timings in the structure in FIG. 13A. Two signals (for example, oscillator output phases 1 and 2) with phases different from each other by 90 degrees are input to the EX-OR circuit 402 and the signal output from the EX-OR circuit 402 is used as a selection signal.

FIGS. 14A to 14D show the operation timings of the second selection circuit 13 shown in FIG. 6. As described above, the second selection circuit 13 receives differential signals such as the in-phase component carrier signals (LO_I and LO_IB) and the quadrature component carrier signals (LO_Q and LO_QB) and, depending on the selection signal, outputs the carrier signal of either the in-phase component or the quadrature component to the digital amplifier 100.

Figure 14A:
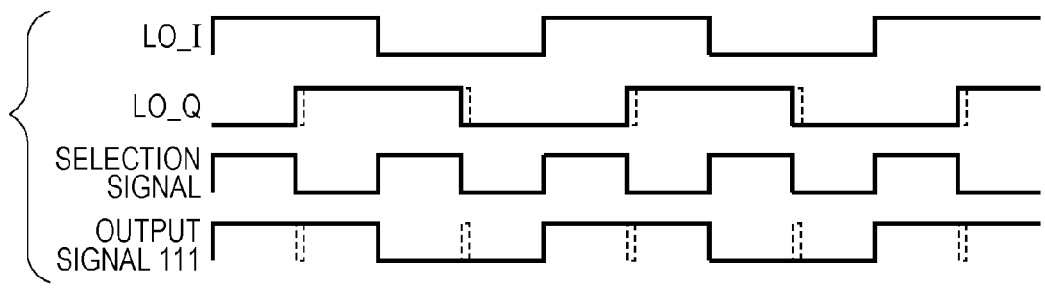
FIGS. 14A to 14D show the operation timings of a second selection circuit shown in FIG. 6.
Figure 14B:
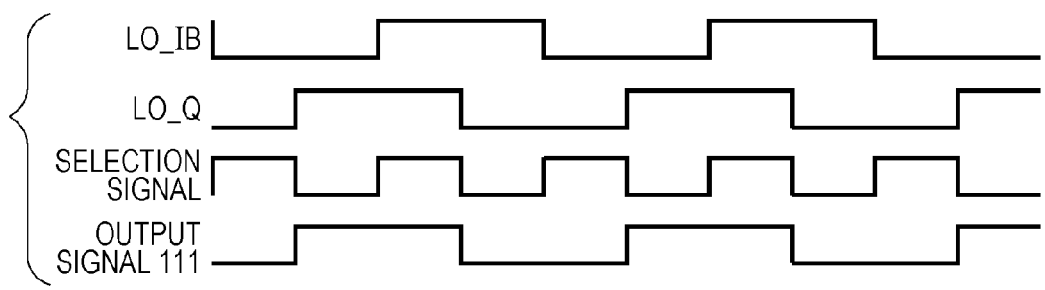
Figure 14C:
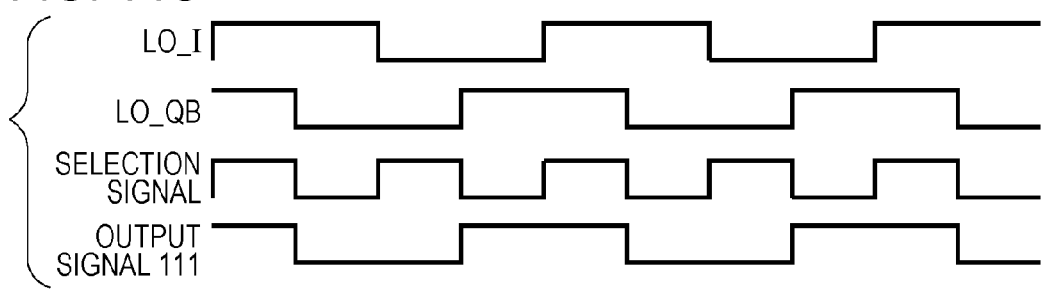
Figure 14D:
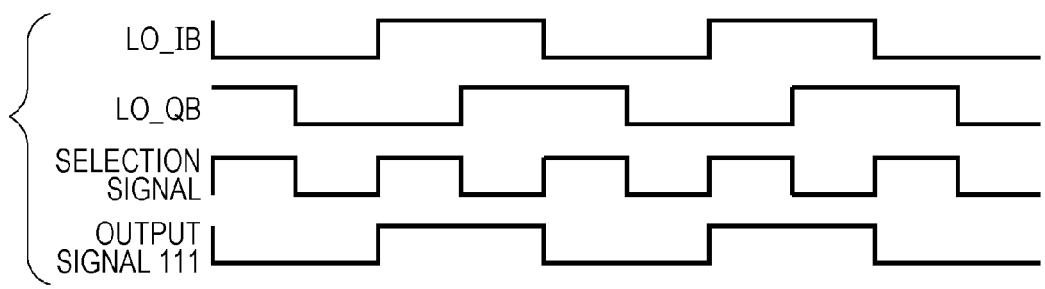

Depending on whether the in-phase component (BB_I) and the quadrature component (BB_Q), which are digital baseband data, are positive or negative, the second selection circuit 13 performs switching between a positive phase (LO_I or LO_Q) and a negative phase (LO_IB or LO_QB) and outputs one of them. There are four patterns of switching shown in FIGS. 14A to 14D. That is, switching between LO_I and LO_Q (FIG. 14A), switching between LO_IB and LO_Q (FIG. 14B), switching between LO_I and LO_QB (FIG. 14C), and switching between LO_IB and LO_QB (FIG. 14D). For example, it can be seen that, in switching between LO_I and LO_Q shown in FIG. 14A, the output signal 15 is switched between LO_I and LO_Q depending on the selection signal.

However, in actual operation of the circuit, a spike waveform is output momentarily on the output signal 15 at the timing of a falling edge of the selection signal. A spike waveform is expected to be generated by a slight displacement of LO_Q to the right side in the drawing, as shown by the dashed lines in FIG. 14A.

As a measure against this, it is necessary to stop switching between the in-phase component and the quadrature component depending on the selection signal and output one of LO_I, LO_IB, LO_Q, and LO_QB depending on whether the combination of the in-phase component (BB_I) and the quadrature component (BB_Q), which are digital baseband data, are positive or negative. This suppresses the generation of spike waveforms and prevents unnecessary power consumption from increasing.

As described above, according to embodiment 1, when the capacitor 103 for the in-phase component (BB_I) and the capacitor 104 for the quadrature component (BB_Q) are provided on the output of the class-D amplifier 101, replacement with a different capacitance value is not performed before and after switching between the in-phase component (BB_I) and the quadrature component (BB_Q). This prevents unnecessary current from flowing between the capacitor 103 and the capacitor 104 due to differences between the DC voltages of the capacitor 103 and the capacitor 104, enabling the in-phase component (BB_I) and the quadrature component (BB_Q) to be synthesized correctly using one SCPA.

Two N-channel transistors (or two P-channel transistors), which are output stage transistors in the logic circuit 102, may be arranged adjacently to each other in a single isolation region to reduce the area on the semiconductor integrated circuit and achieve cost reduction.

Embodiment 2

Figure 15:
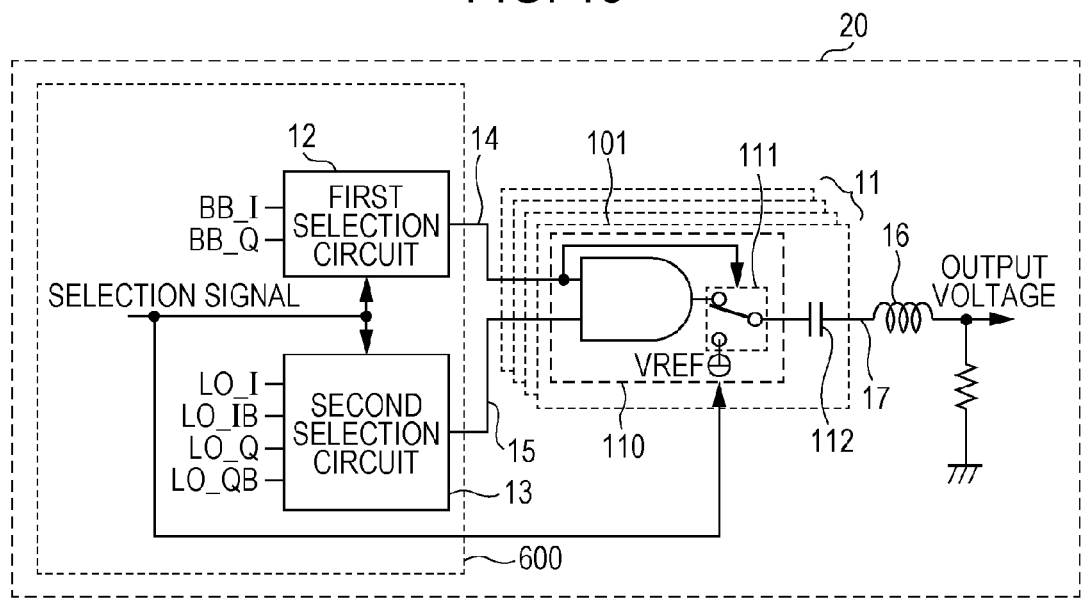
FIG. 15 shows the structure a transmission apparatus according to embodiment 2 of the present disclosure.

FIG. 15 shows the structure of a transmission apparatus 20 according to embodiment 2 of the present disclosure. The structure of the transmission apparatus 20 will be described below with reference to FIG. 15.

The digital amplifier 11 includes a plurality of class-D amplifiers 101 connected in parallel to each other. Each of the plurality of class-D amplifiers 101 includes two input terminals, one output terminal, a fundamental amplifier circuit 110 having a switch 111 that outputs a result of a logic operation of signals input from the two input terminals or a constant voltage (VREF) depending on the logic of a signal input from one of the two input terminals to the output terminal, and a capacitor 112 connected in series to the output terminal of the fundamental amplifier circuit 110. The input data converter 600 includes the first selection circuit 12 and the second selection circuit 13.

Since the output signal of the fundamental amplifier circuit 110 is a square wave including odd-number-order harmonic wave components, fundamental wave signal components are extracted from the output signal of the fundamental amplifier circuit 110 by series resonance of the inductor 16 and the capacitor 112 connected in series to the two signal output terminal of the fundamental amplifier circuit 110.

Figure 16:
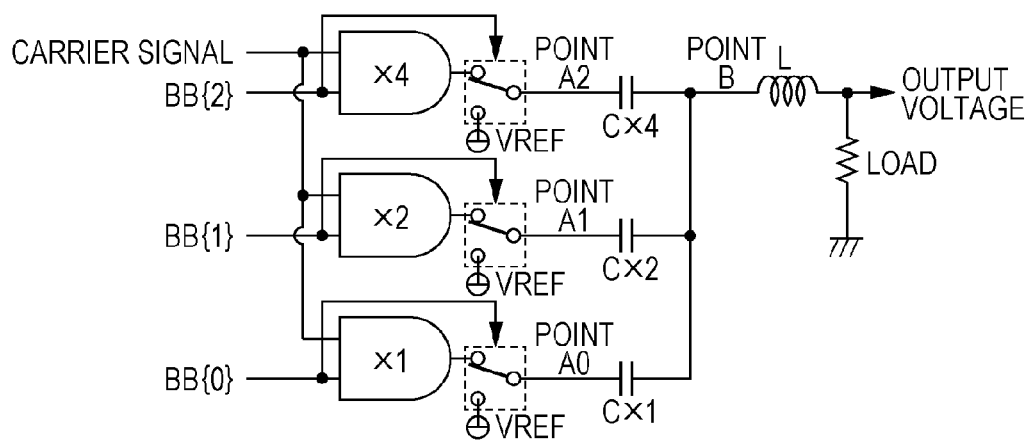
FIG. 16 shows the structure of an SCPA according to embodiment 2 of the present disclosure that receives three bits in parallel.
Figure 17:
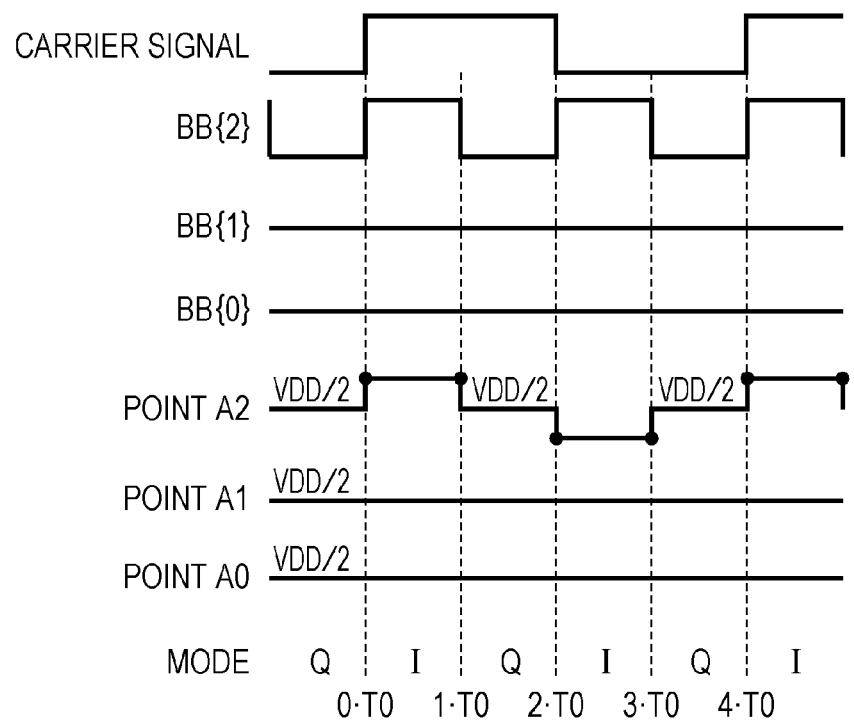
FIG. 17 shows the waveforms of various signals to be input to the SCPA in FIG. 16 and signal waveform at points A0 to A2.

FIG. 16 shows the structure of an SCPA according to embodiment 2 of the present disclosure that receives three bits in parallel and FIG. 17 shows the waveforms of various signals to be input to the SCPA in FIG. 16 and signal waveforms at points A0 to A2.

In FIG. 16, the switches corresponding to the bits BB{2} to BB{0} of digital baseband data are connected to the AND output when the bits are H or connected to VREF (=VDD/2) when the bits are L.

Figure 4:
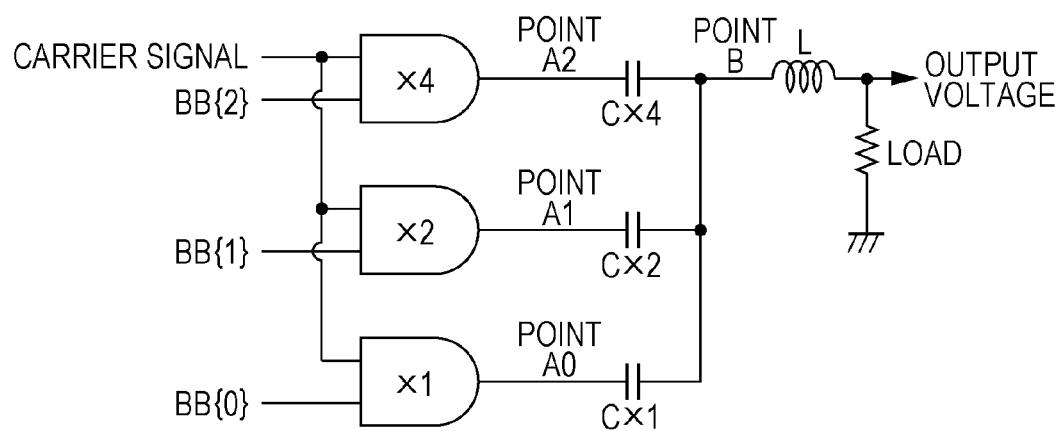
FIG. 4 shows the structure of an SCPA that receives three bits in parallel.
Figure 5:
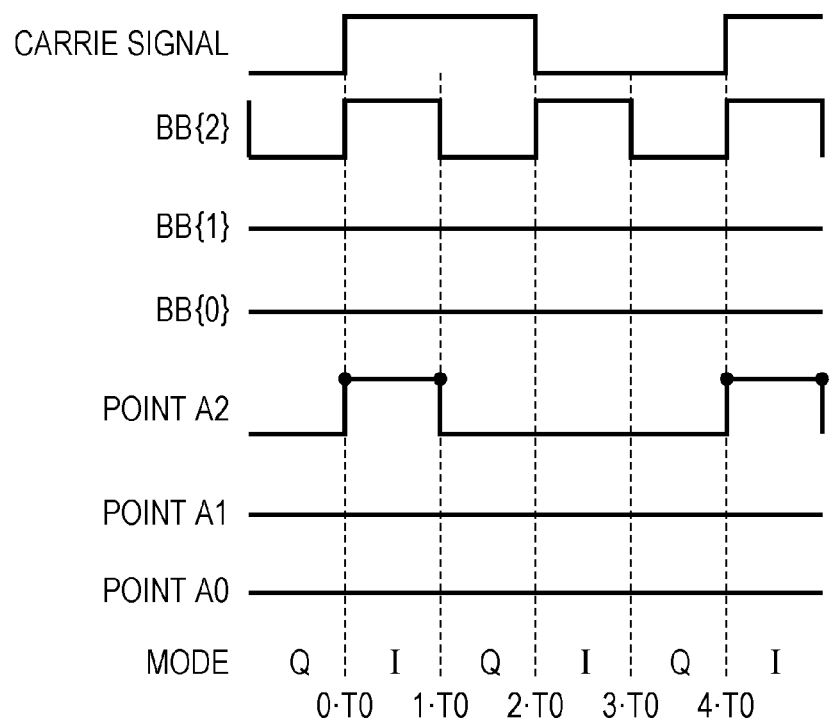
FIG. 5 shows the waveforms of various signals input to the SCPA in FIG. 4 and the signal waveforms at points A0 to A2.

FIG. 17 represents the time period equivalent to one cycle of the carrier signal. As in FIG. 5, BB_I=4 and BB_Q=0 are input as digital baseband signals and switching between the in-phase component (BB_I) and the quadrature component (BB_Q) is performed at intervals of one-quarter the carrier cycle. Since the same weighting as in the SCPA in FIG. 4 is applied to the SCPA in FIG. 16, digital baseband input signal BB{2} is H from time 0·T0 to time 1·T0, which is the output period of BB_I and BB{1} and BB{0} are L. That is, capacitor C×2 connected to point A1 and capacitor C×1 connected to point A0 are connected to VREF. However, since BB{2} is H, the waveform of H, which is the same as that of the carrier signal, appears at point A2. The H signal at point A2 is equal to the power voltage (VDD) of AND.

Next, digital baseband input signals BB{2}, BB{1}, and BB{0} are L from time 1·T0 to time 2·T0, which is the output period of BB_Q. As a result, the switches corresponding to the bits are connected to VREF (=VDD/2) and capacitors C×4, C×2, and C×1, which are connected to A2, A1, and A0, are connected to VREF (=VDD/2).

Next, digital baseband input signal BB{2} is H from time 2·T0 to time 3·T0, which is the output period of BB_I, and BB{1} and BB{0} are L. That is, capacitor C×2 connected to point A1 and capacitor C×1 connected to point A0 are connected to VREF. However, since BB{2} is H, the waveform of L, which is the same as that of the carrier signal, appears at point A2. The L signal at point A2 is equal to the GND electric potential (0 V) of AND.

In addition, from time 3·T0 to time 4·T0, which is the output period of BB_Q, the same operation is performed as in the case from time 1·T0 to time 2·T0 and the switches corresponding to the bits are connected to VREF (=VDD/2) and capacitor C×4 connected to point A2, capacitor C×2 connected to point A1, and capacitor C×1 connected to point A0 are connected to VREF (=VDD/2).

In the operation from time 0·T0 to time 4·T0 above, the average output voltage of the fundamental amplifier circuit 110 becomes one-half the power voltage (VDD). It can be seen that the voltage waveform that appears at point B has a voltage amplitude obtained by attenuating the waveform from the power voltage (VDD) of AND that appears at point A2 to the GND electric potential (0 V) of AND using the capacitance attenuator formed by C×4 and C×(2+1). However, the DC operation voltage at point B is the GND electric potential transferred through a load (resistance) and inductor (L) that pass a DC voltage.

The SCPA in this embodiment has a better symmetric property in a vertical direction of the voltage waveform at point A2 than the SCPA shown in FIG. 4. When the time period of H is equal to the time period of L, even-number-order harmonic wave components are low generally. The voltage waveform at point A2 is represented as expression (10) including a δ function array.

$$\frac{Va2(t)}{2} \cdot \sum_{n=-\infty}^{\infty} \delta\{t-(4\cdot n)\cdot T0\} + \frac{Va2(t)}{2} \cdot \sum_{n=-\infty}^{\infty} \delta\{t-(4\cdot n+1)\cdot T0\} - \tag{10}$$

$$\frac{Va2(t)}{2} \cdot \sum_{n=-\infty}^{\infty} \delta\{t-(4\cdot n+2)\cdot T0\} -$$

$$\frac{Va2(t)}{2} \cdot \sum_{n=-\infty}^{\infty} \delta\{t-(4\cdot n+3)\cdot T0\}$$

Expression (11) is obtained by Fourier-transforming expression (10).

$$\int_{-\infty}^{\infty} \frac{Va2s(t)}{2} \cdot \left\{ \frac{1}{T04} \sum_{n=-\infty}^{\infty} e^{j\cdot n\cdot\omega 04\cdot t} \right\} dt + \tag{11}$$

$$\int_{-\infty}^{\infty} \frac{Va2s(t)}{2} \cdot \left\{ \frac{1}{T04} \sum_{n=-\infty}^{\infty} e^{-j\cdot n\cdot(\pi/2)} \cdot e^{j\cdot n\cdot\omega 04\cdot t} \right\} dt -$$

$$\int_{-\infty}^{\infty} \frac{Va2s(t)}{2} \cdot \left\{ \frac{1}{T04} \sum_{n=-\infty}^{\infty} e^{-j\cdot n\cdot\pi} \cdot e^{j\cdot n\cdot\omega 04\cdot t} \right\} dt -$$

$$\int_{-\infty}^{\infty} \frac{Va2s(t)}{2} \cdot \left\{ \frac{1}{T04} \sum_{n=-\infty}^{\infty} e^{-j\cdot n\cdot\pi} \cdot e^{-j\cdot n\cdot(\pi/2)} \cdot e^{j\cdot n\cdot\omega 04\cdot t} \right\} dt$$

Va2s(t) is the after-sampling data of Va2(t).

Since $e^{-j\cdot n\cdot\pi}=+1$ (n=even number) and $e^{-j\cdot n\cdot\pi}=-1$ (n=odd number) hold based on Euler formula $e^{-j\theta}=\cos\theta-j\sin\theta$, the first term is cancelled by the third term and the second term is cancelled by the fourth term in expression (11) when n=even number. That is, the spectrum of the voltage signal at point A2 in FIG. 17 does not include even-number-order harmonic waves. Consequently, there is no need to add a filter for attenuating unnecessary even-number-order harmonic wave components, so the cost is reduced and a power loss is not caused.

Figure 18:
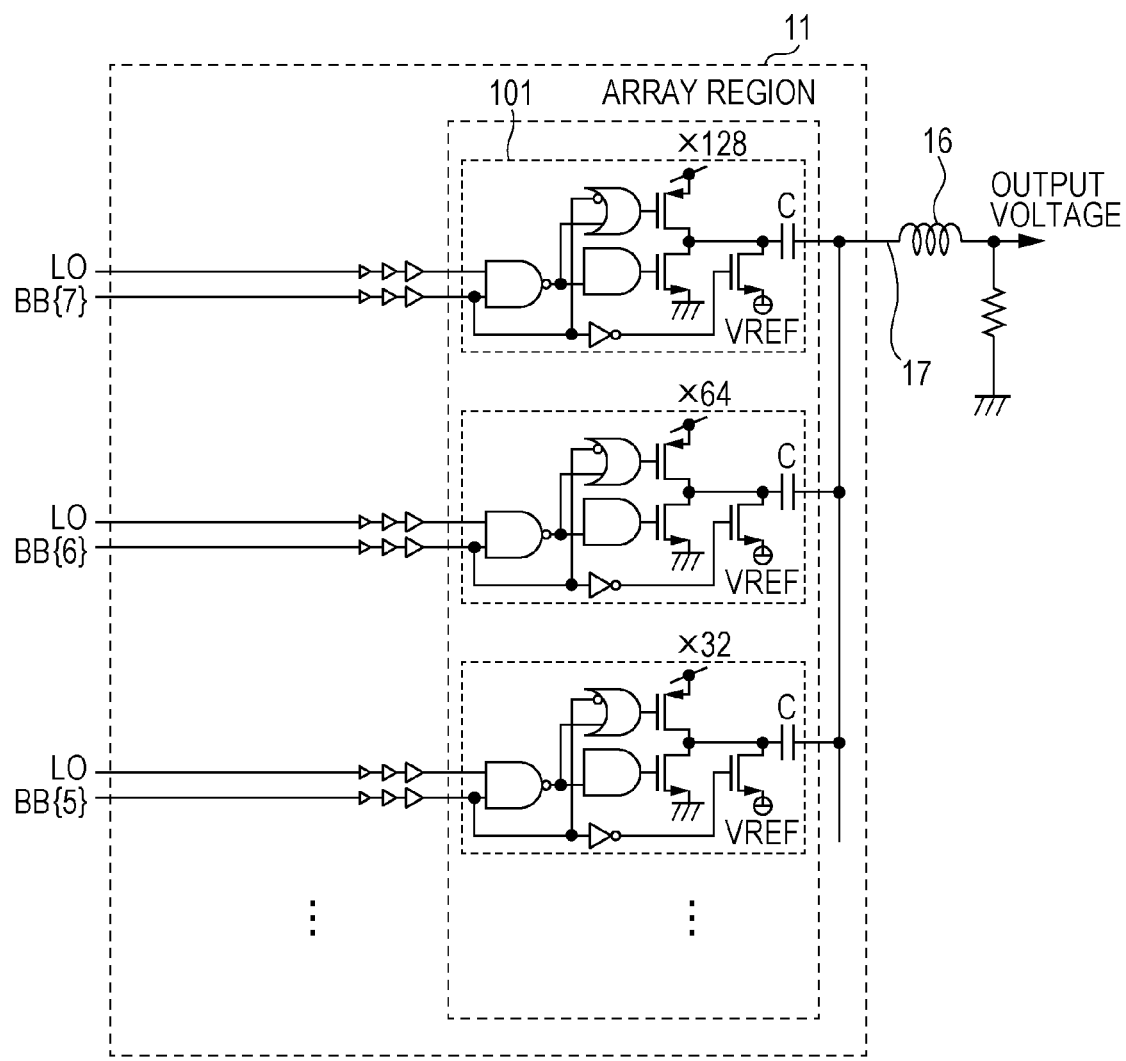
FIG. 18 shows an example of the internal structure of a digital amplifier shown in FIG. 15.
Figure 19:
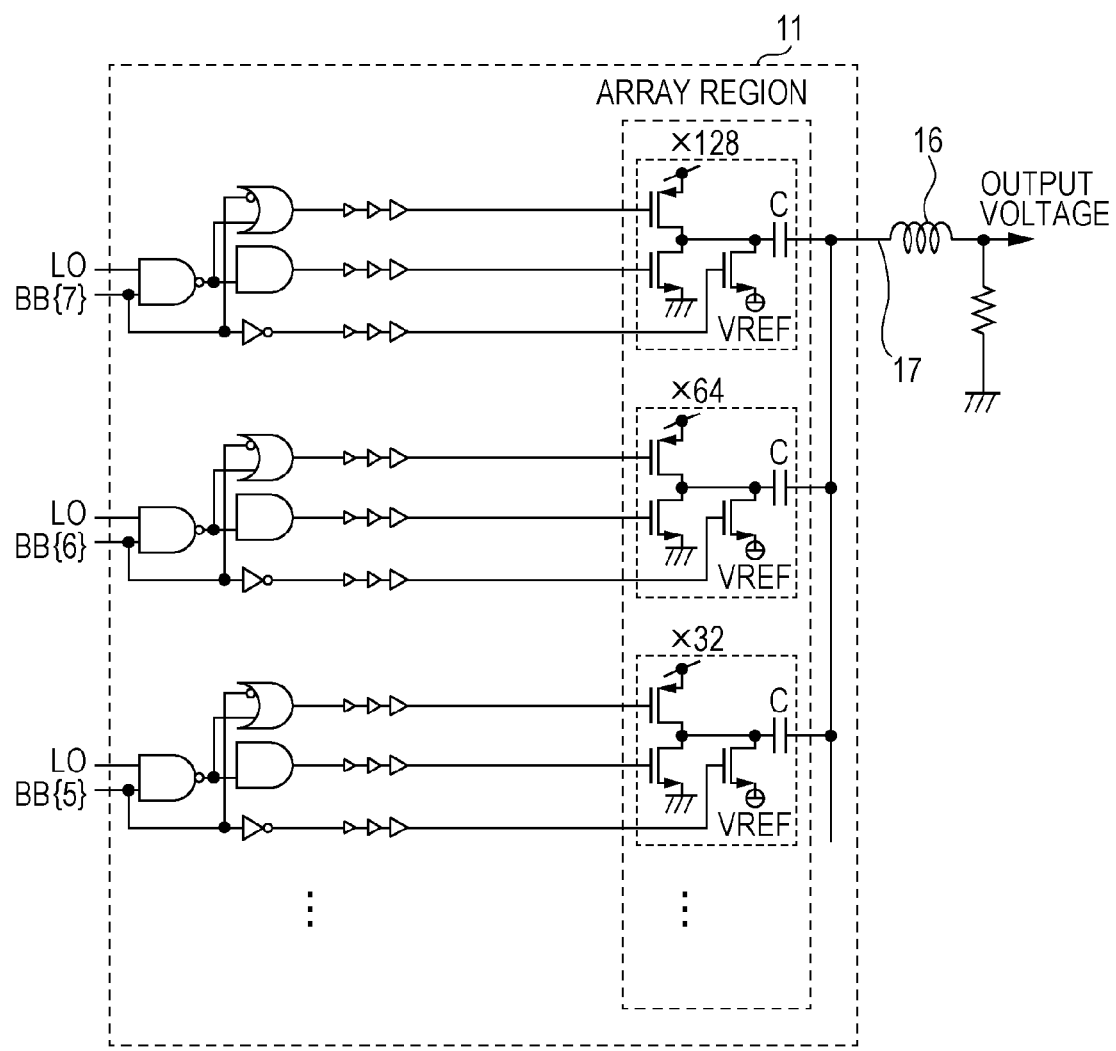
FIG. 19 shows an example of the internal structure of a digital amplifier shown in FIG. 15.

FIGS. 18 and 19 show examples of the internal structure of the digital amplifier 11 shown in FIG. 15. In these examples, the in-phase component (BB_I) and the quadrature component (BB_Q), which are digital baseband data, are 8-bit digital data.

Although the digital amplifier in FIG. 18 is logically the same as that in FIG. 19, the structure in FIG. 19 has less circuit elements in the array region. The array region is a region in which a plurality of unit cells (layout arrangement on a semiconductor integrated circuit) are densely arranged on a semiconductor integrated circuit. Each of the plurality of unit cells includes an N-channel transistor and a P-channel transistor used for the output terminal of the fundamental amplifier circuit, a switch applying a constant voltage that is one-half the power voltage of the fundamental amplifier circuit to the output terminal of the fundamental amplifier circuit, and the capacitor connected in series to the output terminal of the fundamental amplifier circuit. A buffer driving each of the unit cells is provided as a prestage of each of the unit cells.

Although all class-D amplifiers 101 have an AND circuit and an OR circuit in the structure in FIG. 18, one pair of an AND circuit and an OR circuit are used for each of the bits (BB{7}, BB{6}, BB{5}, . . . ) of digital baseband data in the structure in FIG. 19. This reduces redundant circuits that output the same logic, thereby achieving reduction in current consumption.

Embodiment 3

Figure 20:
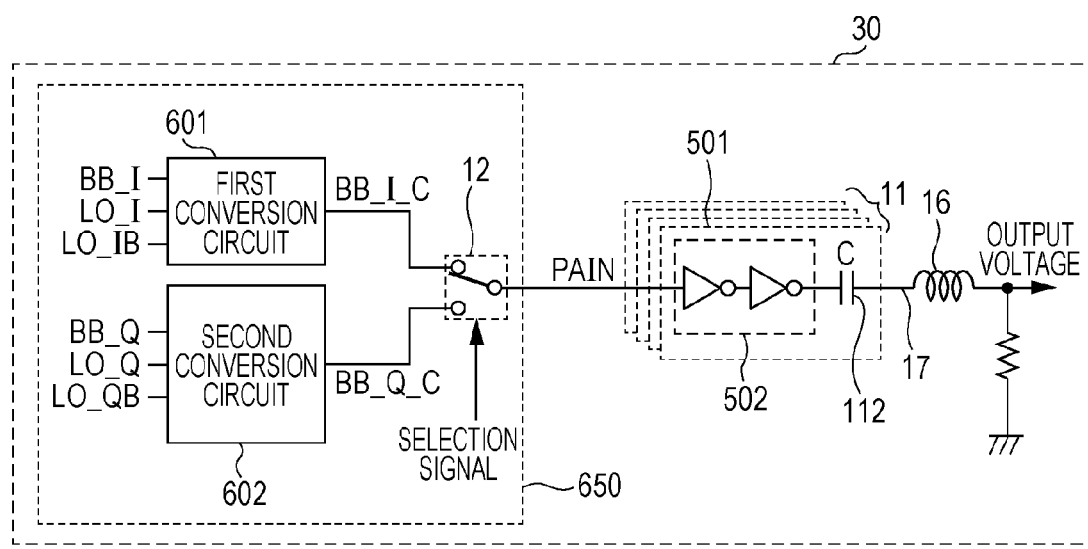
FIG. 20 shows the structure of a transmission apparatus according to embodiment 3 of the present disclosure.

FIG. 20 shows the structure of a transmission apparatus 30 according to embodiment 3 of the present disclosure. The structure of the transmission apparatus 30 will be described with reference to FIG. 20.

The digital amplifier 11 has a plurality of class-D amplifiers 501 connected in parallel to each other. The class-D amplifier 501 includes a fundamental amplifier circuit 502, which has one input terminal and one output terminal and outputs, to the output terminal, a logic output that depends on the logic of a signal input from the input terminal, and the capacitor 112, which is connected in series to the output terminal of the fundamental amplifier circuit 502. An input data converter 650 includes the first selection circuit 12, a first conversion circuit 601, and a second conversion circuit 602.

The first selection circuit 12 receives a selection signal and the in-phase component (BB_I_C) and quadrature component (BB_Q_C), which are digital baseband data after conversion of the transmission signal, and outputs either the in-phase component (BB_I_C) or the quadrature component (BB_Q_C), which are digital baseband data after conversion, depending on the selection signal, to the digital amplifier 11 as an output signal (PAIN).

The first conversion circuit 601 receives a differential signal such as the in-phase component carrier signal (LO_I and LO_IB) in addition to the in-phase component (BB_I), which is digital baseband data before conversion of the transmission signal, and outputs the in-phase component (BB_I_C), which is digital baseband data after conversion, to the first selection circuit 12. The second conversion circuit 602 receives an differential signal such as the quadrature component carrier signal (LO_Q and LO_QB) in addition to the quadrature component (BB_Q), which is digital baseband data before conversion of the transmission signal, and outputs the quadrature component (BB_Q_C), which is digital baseband data after conversion, to the first selection circuit 12.

The first conversion circuit 601 uses either the positive phase (LO_I) or the negative phase (LO_IB) of the carrier signal depending on whether the in-phase component (BB_I), which is input digital baseband data before conversion, is positive or negative. The second conversion circuit 602 uses either the positive phase (LO_Q) or the negative phase (LO_QB) depending on whether the quadrature component (BB_Q), which is input digital baseband data before conversion, is positive or negative. In addition, while the carrier signal is H, the first conversion circuit 601 and the second conversion circuit 602 adds a value proportional to the in-phase component (BB_I) or the quadrature component (BB_Q), which is digital baseband data before conversion, to substantially one-half the maximum value of digital baseband data. While the carrier signal is L, the first conversion circuit 601 and the second conversion circuit 602 subtracts a value proportional to the in-phase component (BB_I) or the quadrature component (BB_Q), which is digital baseband data before conversion, from substantially one-half the maximum value of digital baseband data.

Figure 21:
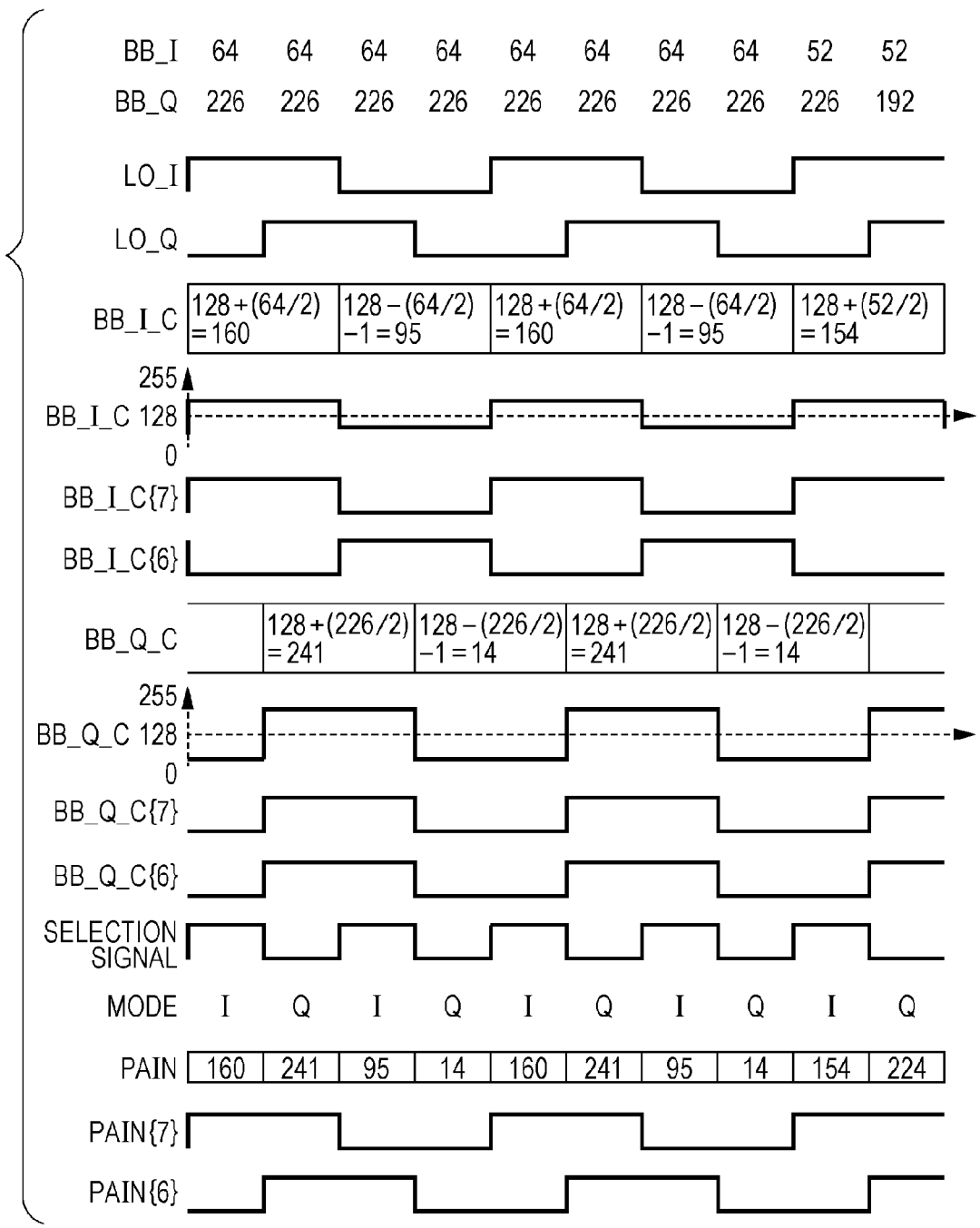
FIG. 21 shows the operation timing of the transmission apparatus shown in FIG. 20.

Next, the operation timings of the transmission apparatus 30 shown in FIG. 20 will be described with reference to FIG. 21. FIG. 21 shows the time period equivalent to 2.5 cycles of the carrier signal (LO). The mode in FIG. 21 indicates which of the in-phase component and the quadrature component is being output. In FIG. 21, since both the in-phase component (BB_I) and the quadrature component (BB_Q), which is digital baseband data before conversion, are positive, the positive phase (LO_I and LO_Q) is used as the carrier signal. FIG. 21 indicates that, depending on whether the selection signal with twice the frequency of the carrier wave is high or low, switching between the in-phase component (BB_I_C) and the quadrature component (BB_Q_C) is made, which is converted digital baseband data.

In the first time period (0 to ½ of one carrier cycle), the in-phase component (BB_I), which is digital baseband data before conversion to be input to the first conversion circuit 601, is 64. The digital baseband data is 8 bits long and one-half the maximum value is 128. Since the selected carrier signal (LO_I) is H at this time, the first conversion circuit 601 adds one-half the in-phase component (BB_I=64), which is digital baseband data, to one-half (=128) the maximum value. That is, the following calculation is performed: 128+(64/2)=160.

In the next time period (½ of one carrier cycle to one carrier cycle), since the selected carrier signal (LO_I) is changed to L, the first conversion circuit 601 subtracts one-half the in-phase component (BB_I=64), which is digital baseband data, from one-half (=128) the maximum value. That is, the following calculation is performed: 128−(64/2)−1=95. This means that the digital baseband data after conversion is digital baseband data centered on one-half the maximum value and the amplitude is proportional to the size of digital baseband data before conversion. Since the above calculation is made using digital values, the digits to the right of the decimal point generated by division are rounded down. The reason why 1 is subtracted while carrier signal (LO_I) is L is because a digital value of 95 can be obtained by inverting all bits of the binary representation of the calculation result (=160) when the carrier signal (LO_I) is H.

The input data converter 650 achieves the function of the quadrature modulator by outputting either the in-phase component (BB_I_C) or the quadrature component (BB_Q_C), which is digital baseband data after conversion obtained from the above calculation result, depending on the selection signal, to the digital amplifier 11.

In this structure, time variations of the bits BB_I_C{7} to {0} and BB_Q_C{7} to {0} of digital baseband data after conversion are always represented by a waveform with a duty of 50%. This is because all bits of digital baseband data BB_I_C{7} to {0} and BB_Q_C{7} to {0} after conversion of binary representation are inverted when the carrier signal makes a transition from H to L. In addition, in the first selection circuit 12, time variations of PAIN{7} to {0} for which switching between BB_I_C and BB_Q_C is performed depending on whether the selection signal with twice the frequency of the carrier wave is high or low are always represented by a waveform with a duty of 50%. Since a waveform with a duty of 50% has a good symmetric property in a vertical direction in the time waveform of a voltage and the H period equals the L period, even-number-order harmonic wave components are not generated. Consequently, the spectrum of the output voltage does not include even-number-order harmonic waves, thereby eliminating the need to add a filter for attenuating even-number-order harmonic wave components.

Embodiment 4

Figure 22:
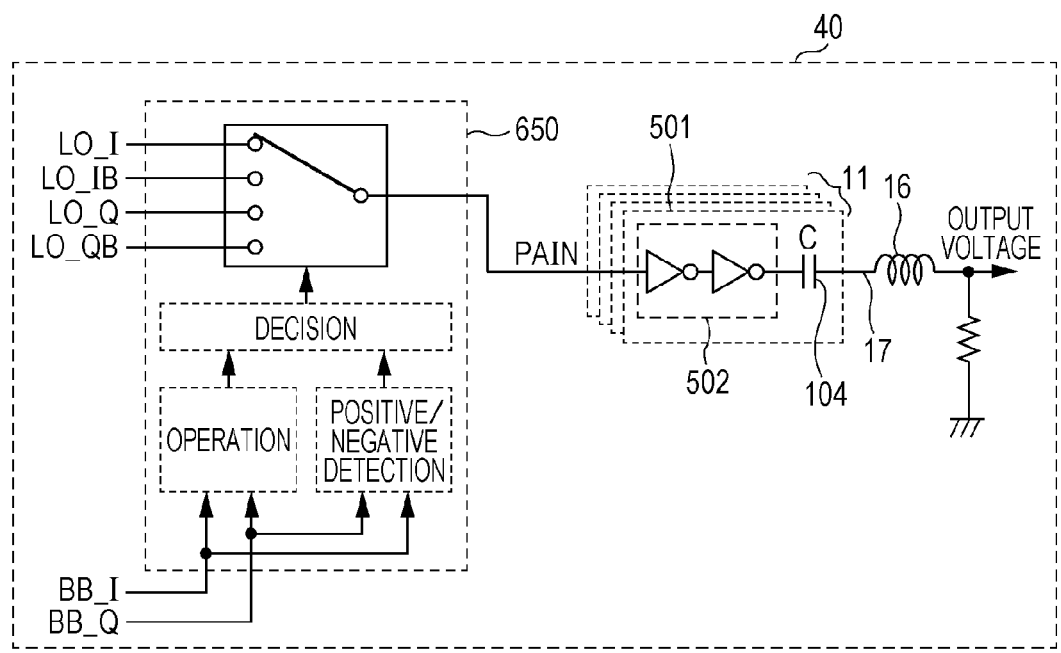
FIG. 22 shows the structure of a transmission apparatus according to embodiment 4 of the present disclosure.

FIG. 22 shows the structure of a transmission apparatus 40 according to embodiment 4 of the present disclosure. The structure of the transmission apparatus 40 will be described below with reference to FIGS. 20 to 22.

The input data converter 650 according to embodiment 4 has the same function as the first selection circuit 12, the first conversion circuit 601, and the second conversion circuit 602 according to embodiment 3. Accordingly, when an input signal is the same, the output signal (PAIN) is also the same. However, the input data converter 650 according to embodiment 4 does not need a selection signal with twice the frequency of the carrier wave, so the input data converter 650 is very effective in reducing power consumption.

The input signals (PAIN{7}, PAIN{6}, ... ) for the digital amplifier 11 according to embodiment 3 shown in FIG. 21 have the same frequency and the same duty (50%) as the carrier signal (LO_I and LO_Q). The input data converter 650 according to embodiment 4 selects one of carrier signals (LO_I, LO_IB, LO_Q, and LO_QB) as an input signal (PAIN) for the digital amplifier 11 by using this feature.

First, signals required by the input data converter 650 will be described with reference to FIG. 21. The waveforms of the bits of BB_I_C, which is digital baseband data after conversion, are determined by the following two factors: (1) the logic (H or L) of the bits in calculation result (=160) while the carrier signal is H and (2) the logic (H or L) of the value of digital baseband data (BB_I=64) before conversion. The following four combinations are possible between (1) and (2).
A: calculation result=H and digital baseband data before conversion=positive
B: calculation result=L and digital baseband data before conversion=negative
C: calculation result=L and digital baseband data before conversion=positive
D: calculation result=H and digital baseband data before conversion=negative As a result, when the procedure of embodiment 3 shown in FIG. 21 is followed, the time waveforms of the bits of digital baseband data BB_I_C after conversion are the same as in BB_I_C{7} in FIG. 21 for A and B. For C and D, the time waveforms are obtained by inversing the phase of the time waveform of BB_I_C{7} in FIG. 21 by 180 degrees. That is, the time waveforms of the bits of BB_I_C have two phases. Similarly, the time waveforms of the bits of the converted digital baseband data BB_Q_C also have two phase states.

Figure 23:
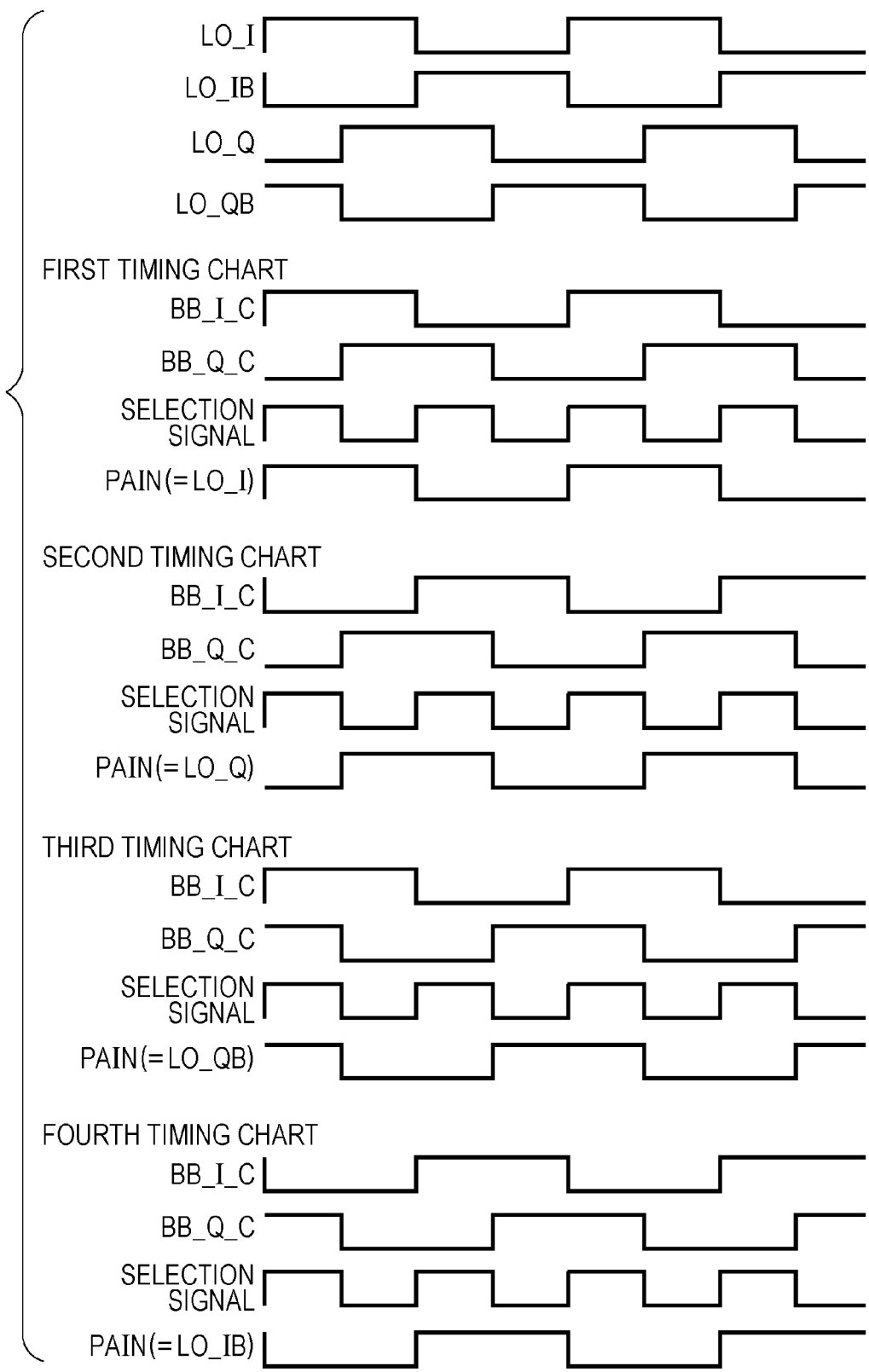
FIG. 23 shows the output signals of an input data converter shown in FIG. 22.

In a case where, as in embodiment 3, switching between BB_I_C and BB_Q_C is performed, which is digital baseband data after conversion, depending on whether the selection signal with twice the frequency of the carrier wave is high or low, then the timing patters are classified into four types as shown in the first timing chart to the fourth timing chart in FIG. 23. That is, as shown in FIG. 23, the input data converter 650 in embodiment 4 needs to select one of the carrier signals (LO_I, LO_IB, LO_Q, and LO_QB) as its output signal (PAIN) to specify the input signals (PAIN{7} to {0}) for the digital amplifier 11.

As described above, the input data converter 650 selects and outputs one of the carrier signals (LO_I, LO_IB, LO_Q, and LO_QB) based on the logic of the calculation result in addition to the logic (positive or negative) of the value of digital baseband data before conversion. Since time variations of the input signal (PAIN) for the digital amplifier 11 shown in FIG. 23 always have a duty of 50% as in embodiment 3, even-number-order harmonic wave components are not generated. Consequently, there is no need to add a filter for attenuating even-number-order harmonic wave components.

The transmission apparatus and the transmission method according to the present disclosure are applicable to, for example, base stations and mobile stations in a mobile communication system and so on.

What is claimed is:
1. A transmission apparatus comprising:
a digital amplifier having
a plurality of class-D amplifiers connected in parallel to each other, each of the class-D amplifiers including
a logic circuit that processes input signals from two input terminals and outputs the processed signals to one of two output terminals, according to a selection signal, and
capacitors connected in series to the two output terminals, respectively;
a first selection circuit that outputs either an in-phase component or a quadrature component of a transmission signal to the digital amplifier depending on the selection signal; and
a second selection circuit that outputs either an in-phase component carrier signal or a quadrature component carrier signal to the digital amplifier depending on the selection signal.
2. The transmission apparatus according to claim 1,
wherein the logic circuit includes a NAND circuit and a circuit that outputs the processed signals to one of the two output terminals.
3. The transmission apparatus according to claim 1,
wherein the logic circuit includes transistors cascode-connected to the two output terminals, respectively.
4. The transmission apparatus according to claim 1,
wherein the logic circuit includes two N-channel transistors, which are used as the two output terminals, respectively, and two P-channel transistors, which are used as the two output terminals, respectively, and the two N-channel transistors or the two P-channel transistors are arranged adjacently to each other in a single isolation region on a semiconductor.
5. The transmission apparatus according to claim 1,
wherein the second selection circuit outputs one of a positive phase of the in-phase component carrier signal, a negative phase of the in-phase component carrier signal, a positive phase of the quadrature component carrier signal, and a negative phase of the quadrature component carrier signal depending on whether the in-phase component and the quadrature component of the transmission signal are positive or negative.
6. A transmission apparatus comprising:
a digital amplifier having
a plurality of class-D amplifiers connected in parallel to each other, each of the class-D amplifiers including
an amplifier circuit that outputs a result of a logic operation of signals input from one or more input terminals to one or more output terminals and
a capacitor connected in series to the output terminal;
a first selection circuit that outputs either an in-phase component or a quadrature component of a transmission signal to the digital amplifier; and a second selection circuit that outputs either an in-phase component carrier signal or a quadrature component carrier signal to the digital amplifier, wherein a time-average output voltage of the amplifier circuit is one-half a power voltage of the amplifier circuit.

7. The transmission apparatus according to claim 6, wherein the amplifier circuit outputs either the result of the logic operation of the input signals or a constant voltage that is one-half the power voltage of the amplifier circuit.

8. The transmission apparatus according to claim 6, wherein a plurality of unit cells are arranged on a semiconductor and a buffer driving each of the unit cells is provided as a prestage of each of the unit cells, each of the unit cells including an N-channel transistor and a P-channel transistor used as the one or more output terminals, a switch applying a constant voltage that is one-half the power voltage of the amplifier circuit to the one or more output terminals, and the capacitors connected in series to the one or more output terminals.

9. The transmission apparatus according to claim 6, wherein the second selection circuit outputs one of a positive phase of the in-phase component carrier signal, a negative phase of the in-phase component carrier signal, a positive phase of the quadrature component carrier signal, and a negative phase of the quadrature component carrier signal depending on whether the in-phase component and the quadrature component of the transmission signal are positive or negative.

10. A transmission apparatus comprising:
a digital amplifier having
a plurality of class-D amplifiers connected in parallel to each other, each of the class-D amplifiers including
an amplifier circuit that outputs a result of a logic operation of signals input from an input terminal to an output terminal and
a capacitor connected in series to the output terminal;
a first selection circuit; and
an input data converter including
a first conversion circuit that receives both an in-phase component of a transmission signal and an in-phase component carrier signal, adds a value proportional to the transmission signal to substantially one-half the maximum value of the transmission signal or subtracts a value proportional to the transmission signal from substantially one-half the maximum value of the transmission signal depending on whether the received in-phase component carrier signal is logically high or low, converts the in-phase component, and outputs the converted in-phase component to the first selection circuit, and the second conversion circuit receives the quadrature component of the transmission signal and the quadrature component carrier signal, adds a value proportional to the transmission signal to substantially one-half the maximum value of the transmission signal or subtracts a value proportional to the transmission signal from substantially one-half the maximum value of the transmission signal depending on whether the received quadrature component carrier signal is logically high or low, converts the quadrature component, and outputs the converted quadrature component to the first selection circuit, wherein the first selection circuit outputs the converted in-phase component or the converted quadrature component to the digital amplifier.

11. A transmission method comprising the steps of:
outputting either an in-phase component or a quadrature component of a transmission signal to a digital amplifier;

outputting either an in-phase component carrier signal or a quadrature component carrier signal to the digital amplifier; and processing and outputting either the in-phase component or the quadrature component of the transmission signal and either the in-phase component carrier signal or the quadrature component carrier signal to one of two output terminals to which capacitors are connected in series, respectively.

* * * * *